(12) United States Patent
Kim et al.

(10) Patent No.: US 10,374,585 B2
(45) Date of Patent: Aug. 6, 2019

(54) SIGNAL CALCULATOR

(71) Applicant: SEMICONDUCTOR COMPONENTS INDUSTRIES, LLC, Phoenix, AZ (US)

(72) Inventors: Taesung Kim, Seoul (KR); Seunguk Yang, Anyang (KR); Youngbae Park, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/279,610

(22) Filed: Feb. 19, 2019

(65) Prior Publication Data

US 2019/0190504 A1    Jun. 20, 2019

Related U.S. Application Data

(62) Division of application No. 15/661,690, filed on Jul. 27, 2017, now Pat. No. 10,250,238, which is a (Continued)

(30) Foreign Application Priority Data

May 29, 2015 (KR) .......................... 10-2015-0076714
May 29, 2015 (KR) .......................... 10-2015-0076715

(51) Int. Cl.
| | | |
|---|---|---|
| G11C 27/02 | (2006.01) | |
| H03K 5/00 | (2006.01) | |
| H02K 17/00 | (2006.01) | |
| G06G 7/16 | (2006.01) | |
| H03K 4/502 | (2006.01) | |
| H03K 4/94 | (2006.01) | |

(52) U.S. Cl.
CPC ............... *H03K 5/00* (2013.01); *G06G 7/16* (2013.01); *H03K 4/502* (2013.01); *H03K 4/94* (2013.01)

(58) Field of Classification Search
CPC ..... G11C 27/026; G11C 27/024; G11C 27/02; G01R 13/342; H03K 17/063
USPC .............................................. 327/91–98, 131
See application file for complete search history.

(56) References Cited

U.S. PATENT DOCUMENTS

| | | |
|---|---|---|
| 6,369,665 B1 | 4/2002 | Chee et al. |
| 7,573,250 B2 | 8/2009 | Clavette |

(Continued)

*Primary Examiner* — Anh Q Tra
(74) *Attorney, Agent, or Firm* — AMPACC Law Group, PLLC

(57) ABSTRACT

A signal calculator includes a capacitor and a variable current source. The variable current source charges the capacitor and generates a current corresponding to a predetermined voltage during a first period. A first voltage is generated using a voltage of the capacitor charged during an enable period of a first signal in the first period, and a second voltage is generated using a voltage of the capacitor charged during the first period. The variable current source further generates a current corresponding to the second voltage during a second period. A second signal is generated according to a result of comparing the first voltage with the voltage of the capacitor during the second period, and a fourth voltage is generated by generating and sampling a third voltage which is increased according to a first current during an enable period of the second signal in the second period.

17 Claims, 15 Drawing Sheets

Related U.S. Application Data division of application No. 15/166,847, filed on May 27, 2016, now Pat. No. 9,748,935.

(56) References Cited

U.S. PATENT DOCUMENTS

| | | |
|---|---|---|
| 8,188,772 B2 | 5/2012 | Chung |
| 2005/0231398 A1* | 10/2005 | Ravinuthula ............ G06G 7/14 341/50 |
| 2006/0226893 A1 | 10/2006 | Abel |
| 2006/0261860 A1 | 11/2006 | Yamada |
| 2012/0032748 A1 | 2/2012 | Li et al. |
| 2012/0074860 A1 | 3/2012 | Lee |
| 2013/0215649 A1 | 8/2013 | Huang et al. |
| 2013/0294118 A1 | 11/2013 | So et al. |
| 2014/0292402 A1* | 10/2014 | Nandy ..................... H03K 9/08 329/312 |
| 2014/0313798 A1* | 10/2014 | Eum ....................... H03K 3/015 363/89 |
| 2017/0264299 A1* | 9/2017 | Kim ..................... H03K 19/177 |

* cited by examiner

SIGNAL CALCULATOR

CROSS-REFERENCE TO RELATED APPLICATIONS

This application is a divisional of U.S. patent application Ser. No. 15/661,690, filed on Jul. 27, 2017, which is a divisional of U.S. patent application Ser. No. 15/166,847, filed on May 27, 2016 and now issued as U.S. Pat. No. 9,748,935, which claims priority to and the benefit of Korean Patent Applications Nos. 10-2015-0076715 and 10-2015-0076714, both filed with the Korean Intellectual Property Office on May 29, 2015. All of the aforementioned related applications are incorporated herein by reference in their entirety.

BACKGROUND

(a) Technical Field

Embodiments relate to a signal calculator.

(b) Description of the Related Art

A plurality of configurations are required for calculating signals which represent information on voltage or time, etc. For example, a signal calculator may require a capacitor, a resistance, and a current source, etc. Furthermore, a value of each configuration has to accurately be set for the signal calculator to perform calculation. However, an error may occur in setting the value of each of the configurations and accuracy of a calculated result may decrease due to the error.

SUMMARY

The present disclosure is directed to providing a signal calculator capable of decreasing an influence on a signal calculation result by a configuration of the signal calculator.

A voltage multiplier according to an embodiment includes a first capacitor, a first comparator which generates time information according to a result of comparing a voltage charged in the first capacitor by a first current with a first voltage, and a time copier which copies the time information, wherein a third voltage charged in the first capacitor may be generated by a second current corresponding to a second voltage during a first period corresponding to the copied time information.

The time copier may copy the time information based on a result of comparing a fourth voltage, which is a sample of a voltage charged in a second capacitor during a period corresponding to the time information, with a fifth voltage charged in the second capacitor by a third current.

The time copier may include a first switch including one end coupled to one end of the second capacitor and which is turned on during the period corresponding to the time information, a second switch including one end coupled to the one end of the second capacitor and which is turned on during a predetermined second period after the fourth voltage is sampled, and a third switch coupled in parallel to both ends of the second capacitor. The third switch may be turned on at a first time point between a time point at which the fourth voltage is sampled and a starting time point of the second period and at a second time point after an end time point of the second period.

The time copier may further include a fourth switch including one end electrically coupled to the one end of the second capacitor and which is turned on to sample the fourth voltage and a third capacitor coupled to the other end of the fourth switch.

The time copier may further include a fifth switch including one end electrically coupled to the one end of the second capacitor and which is turned on during the second period, and a second comparator which includes a first input terminal coupled to the third capacitor and a second input terminal coupled to the other end of the fifth switch, and which outputs a result of comparing an input to the first input terminal with an input to the second input terminal.

The voltage multiplier may further include a logic operation part which generates the copied time information based on an output of the second comparator during the second period.

The time copier may further include a current source coupled to the other end of the first switch and the other end of the second switch and configured to supply the third current.

The time copier may further include a resistance including one end coupled to the other end of the first switch and the other end of the second switch and the other end to which a predetermined voltage is supplied.

The voltage multiplier may further include a first switch including one end coupled to one end of the first capacitor and which is turned on during the first period and a current generator coupled to the other end of the first switch and configured to generate the second current by copying a current determined according to the second voltage.

The current generator may include a transistor, a resistance coupled to one end of the transistor, an error amplifier including an output terminal coupled to a gate of the transistor, a first input terminal to which the second voltage is input, and a second input terminal coupled to the one end of the transistor, a current mirror coupled to the other end of the transistor and configured to copy a current flowing in the transistor, and a current source which generates the second current according to a current transmitted from the current mirror.

A time divider according to another embodiment may include a first switch and a second switch which perform a switching operation according to a first signal, which represents a first time, and a second signal, which represents a second time, respectively, a first capacitor coupled to one end of the first switch and one end of the second switch, and a comparison part which generates an output based on a period for a voltage which is increased according to a first current based on a first voltage corresponding to the first time to reach a second voltage corresponding to the second time.

The comparison part may include a current source which supplies the first current, a first switch including one end coupled to the current source and which is turned on during a predetermined first period, a second capacitor including one end coupled to the other end of the first switch, a second switch coupled in parallel to both ends of the second capacitor and which is turned off during the first period, and a comparator which compares a voltage charged in the second capacitor with the second voltage.

The comparison part may further include a transistor, a resistance coupled to one end of the transistor, an error amplifier including an output terminal coupled to a gate of the transistor, a first input terminal to which the first voltage is input, and a second input terminal coupled to the one end of the transistor, and a current mirror coupled to the other end of the transistor and configured to copy a current flowing in the transistor. The current source may generate the first current according to a current transmitted from the current mirror.

The time divider may further include a third switch including one end coupled to one end of the first capacitor and which is turned on at a first sampling time point, a fourth switch including one end coupled to the one end of the first capacitor and which is turned on at a second sampling time point, a second capacitor coupled to the other end of the third switch, and a third capacitor coupled to the other end of the fourth switch. The first voltage may be a voltage sampled in the second capacitor, and the second voltage may be a voltage sampled in the third capacitor.

The time divider may further include a first current source coupled to the other end of the first switch and a second current source coupled to the other end of the second switch.

The time divider may further include a current source coupled to the other end of the first switch and the other end of the second switch.

The time divider may further include a third switch coupled to both ends of the first capacitor. The third switch may be turned on after each of the first sampling time point and the second sampling time point has ended.

The time divider may further include a second capacitor coupled to the other end of the first switch, a third capacitor coupled to the other end of the second switch, a third switch including one end coupled to one end of the second capacitor and which is turned on at a first sampling time point, a fourth switch including one end coupled to one end of the third capacitor and which is turned on at the first sampling time point, a fourth capacitor coupled to the other end of the third switch, and a fifth capacitor coupled to the other end of the fourth switch. The first voltage may be a voltage sampled in the fourth capacitor, and the second voltage may be a voltage sampled in the fifth capacitor.

The time divider may further include a current source coupled to one end of the first capacitor.

The time divider may further include a fifth switch coupled to both ends of the first capacitor. The fifth switch may be turned on after the first sampling time point has ended.

A signal calculator according to still another embodiment may include a variable current source and a capacitor charged by a current supplied from the variable current source. In the signal calculator, the variable current source may generate a current corresponding to a reference voltage during a first period, may generate a first voltage using a voltage of the capacitor charged during an enable period of a first signal in the first period, and may generate a second voltage using a voltage of the capacitor charged during the first period. The variable current source may generate a current corresponding to the second voltage during a second period, may generate a second signal according to a result of comparing the first voltage with a voltage of the capacitor in the second period, and may generate a fourth voltage by generating and sampling a third voltage which is increased according to a first current during an enable period of the second signal. The third voltage may increase according to the first current during a third period, the variable current source may generate a current corresponding to a predetermined voltage after a period for the third voltage to reach the fourth voltage has passed, and a voltage of the capacitor may be sampled at an end time point of the third period.

A switching operation of a power switch may be controlled according to a voltage on the basis of a result of comparing a voltage sampled at the end time point of the third period with a predetermined reference voltage, and the predetermined voltage may correspond to a peak voltage of a current flowing in the power switch.

A signal calculator according to yet another embodiment may include a variable current source and a capacitor charged by a current supplied from the variable current source. In the signal calculator, the variable current source may generate a current corresponding to a predetermined voltage during a first period, may generate a first voltage using a voltage of the capacitor charged during an enable period of a first signal in the first period, and may generate a second voltage using a voltage of the capacitor charged during the first period. The variable current source may generate a current corresponding to the second voltage during a second period, may generate a second signal according to a result of comparing the first voltage with a voltage of the capacitor during the second period, and may generate a fourth voltage by generating and sampling a third voltage which is increased according to a first current during an enable period of the second signal in the second period.

The variable current source may generate a current corresponding to the predetermined voltage during a third period, and the signal calculator may further include a first capacitor charged by a voltage of the capacitor from a time point at which a period for the third voltage which is increased according to the first current to reach the sampled fourth voltage has passed until an end time point of the third period in the third period.

The signal calculator may sample a voltage of the first capacitor at the end time point of the third period. A switching operation of a power switch may be controlled according to a voltage on the basis of a result of comparing the sampled voltage with a predetermined reference voltage, and the predetermined voltage may correspond to a peak voltage of a current flowing in the power switch.

By the embodiments above, there is provided a signal calculator capable of decreasing an influence on a signal calculation result by a configuration of the signal calculator.

DETAILED DESCRIPTION OF THE EMBODIMENTS

Figure 1:
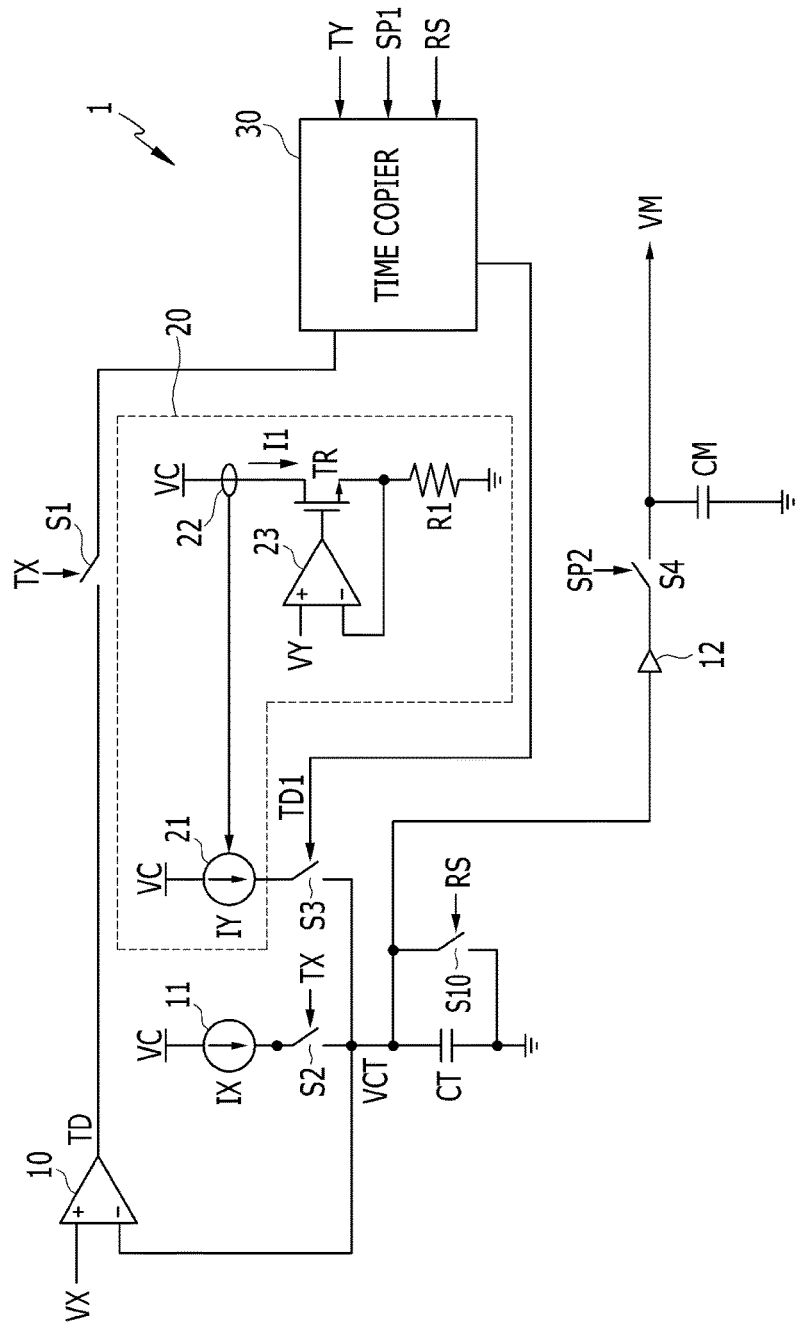
FIG. 1 is a view illustrating a voltage multiplier according to a first embodiment.

Hereinafter, embodiments of the present disclosure will be described in detail with reference to the accompanying drawings to enable those of ordinary skill in the art to which the present disclosure pertains to easily execute the present disclosure. However, embodiments of the present disclosure may be implemented in various different forms and are not limited to the embodiments described herein. Also, in order to clearly describe the present disclosure, parts unrelated to the description have been omitted from the drawings, and like reference numerals are given to like parts throughout the specification.

Throughout the specification, when it is said that a certain part is "connected" to another part, this includes a case in which the certain part and the other part are "directly connected" as well as a case in which the certain part and the other part are "electrically connected" while having another element therebetween. In addition, when it is said that a certain part "includes" a certain element, this does not exclude other elements from being included and the certain part may further include another element unless particularly described otherwise.

Hereinafter, analog signal calculators according to embodiments will be described with reference to the drawings. Embodiments related to a voltage multiplier and a time divider among the analog signal calculators will be described.

First, embodiments related to the voltage multiplier will be described.

FIG. 1 is a view illustrating a voltage multiplier according to a first embodiment.

As illustrated in FIG. 1, a voltage multiplier 1 receives a voltage VX and a voltage VY and generates a voltage VM according to the product of the two voltages. The voltage multiplier 1 according to the embodiment generates and copies time information corresponding to any one of the two voltages VX and VY and generates the voltage VM based on the copied time information and a current corresponding to the other one of the two voltages VX and VY. The embodiment illustrated in FIG. 1 generates and copies a signal TD based on time information corresponding to the voltage VX and generates the voltage VM based on a copied signal TD1 and a current IY corresponding to the voltage VY.

First, the voltage multiplier 1 charges a capacitor CT with a current IX of a current source 11 during a first period according to a signal TX to increase a voltage VCT. The current source 11 uses a voltage VC to generate the current IX. A switch S2 is connected between the current source 11 and one end of the capacitor CT and performs a switching operation according to the signal TX. For example, a switch S1 is turned on by the signal TX at a high level, the current source 11 is connected to the capacitor CT such that the capacitor CT is charged by the current IX, and the voltage VCT increases.

A switch S10 is connected to both ends of the capacitor CT, and the switch S10 performs a switching operation according to a reset signal RS. For example, the switch S10 is turned on by the reset signal RS at a high level, and the capacitor CT is discharged such that the voltage VCT is reset. The reset voltage VCT may be at a ground level.

A comparator 10 generates the signal TD according to a result of comparing the voltage VCT with the voltage VX. The voltage VCT may be input to an inverting terminal (−) of the comparator 10, and the voltage VX may be input to a non-inverting terminal (+) of the comparator 10. The comparator 10 generates the signal TD at a high level when an input to the non-inverting terminal (+) is larger than an input to the inverting terminal (−), and generates the signal TD at a low level in the case opposite to the above.

Then, the comparator 10 may generate the signal TD at a high level from a time point at which the voltage VCT starts to increase until a time point at which the voltage VCT reaches the voltage VX, and may output the signal TD at a low-level during a period in which the voltage VCT is higher than the voltage VX. The signal TD is a signal which represents time information corresponding to the voltage VX and, for example, a high-level period of the signal TD may be determined according to a level of the voltage VX.

The switch S1 is connected between an output terminal of the comparator 10 and a time copier 30, and the switch 1 performs a switching operation according to the signal TX. The switch S1 is turned on by the signal TX at a high-level such that the signal TD is transmitted to the time copier 30.

The time copier 30 may receive the signal TD, a signal TY, a sampling signal SP1, and the reset signal RS, may sample the signal TD according to the sampling signal SP1 in a first period, and may generate the signal TD1 by copying time information based on the signal TD in a second period controlled by the signal TY. The time copier 30 may reset the sampled result according to the reset signal RS.

A detailed configuration of the time copier 30 will be described below with reference to FIG. 2.

A current generator 20 generates the current IY according to the voltage VY. The current generator 20 includes a current source 21, a current mirror 22, an error amplifier 23, a transistor TR, and a resistance R1.

The voltage VY is input to an input terminal (+) of the error amplifier 23, and the other input terminal (−) of the error amplifier 23 is connected to one end of the resistance R1. An output terminal of the error amplifier 23 is connected to a gate of the transistor TR, a drain of the transistor TR is connected to the current mirror 22, and a source of the transistor TR is connected to the one end of the resistance R1.

The current mirror 22 and the transistor TR are biased by the voltage VC, and a current I1 flowing in the transistor TR is copied by the current mirror 22 and transmitted to the current source 21. The current source 21 generates the current IY according to the current transmitted from the current mirror 22.

The error amplifier 23 determines an output so that the voltage VY of the input terminal (+) and the voltage of the other input terminal (−) are equal. The transistor TR controls the current I1 according to the output of the error amplifier 23. The voltage of the other input terminal (−) of the error amplifier 23 is determined by the product of the current I1 and the resistance R1. Then, the current I1 is controlled to a value of VY/R1.

A switch S3 is connected between the current source 21 and the capacitor CT and performs a switching operation according to the signal TD1. For example, the switch S3 is turned on by the signal TD1 at a high level, the capacitor CT is charged by the current IY of the current source 21, and the voltage VCT increases.

A buffer 12 and a switch S4 are connected in series between the one end of the capacitor CT and one end of a capacitor CM. The switch S4 performs a switching operation according to a sampling signal SP2. For example, the switch S4 is turned on by the sampling signal SP2 at a high level, and the voltage VCT is transmitted to the capacitor CM via the buffer 12 and the switch S4. Then, the voltage VCT is sampled in the capacitor CM, and the voltage VM is generated.

Figure 2:
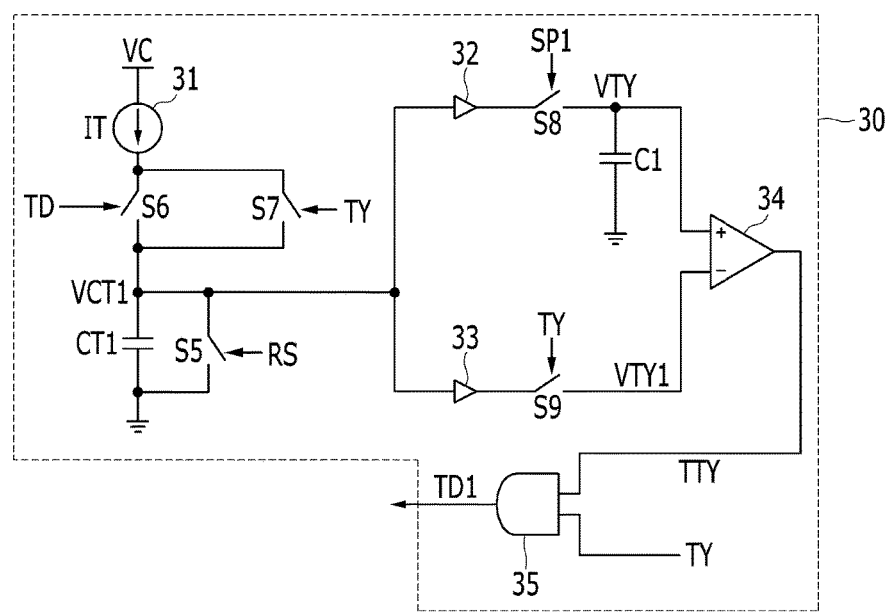
FIG. 2 is a view illustrating a time copier according to the first embodiment.

FIG. 2 is a view illustrating a time copier according to the first embodiment.

The time copier 30 samples a voltage VCT1 generated according to the signal TD by synchronizing with the sampling signal SP1, generates a signal TTY according to a result of comparing the voltage VCT1 which is increased according to the signal TY with a sampled voltage VTY, and generates the signal TD1 by logical operations of the signal TTY and the signal TY.

A current source 31 uses the voltage VC to generate a current IT. A switch S6 is connected between the current source 31 and a capacitor CT1. One end of the capacitor CT1 is connected to the current source 31, and the other end thereof is connected to a ground.

The switch S6 performs a switching operation according to the signal TD during a period in which the switch S1 is turned on. For example, the switch S6 is turned on by the signal TD at a high level, the capacitor CT1 is charged by the current IT during a period in which the switch S6 is turned on, and the voltage VCT1 increases.

A switch S7 is connected between the current source 31 and the capacitor CT1. The switch S7 performs a switching operation according to the signal TY. For example, the switch S7 is turned on by the signal TY at a high level, the capacitor CT1 is charged by the current IT during a period in which the switch S7 is turned on, and the voltage VCT1 increases.

A switch S5 is connected in parallel to both ends of the capacitor CT1. The switch S5 performs a switching operation according to the reset signal RS. For example, the switch S5 may be turned on by the reset signal RS at a high level, the capacitor CT1 may be discharged, and the voltage VCT1 may be reset to the ground level.

A buffer 32 is connected between the one end of the capacitor CT1 and one end of a switch S8, and the other end of the switch S8 is connected to one end of a capacitor C1. One end of the capacitor C1 is connected to a non-inverting terminal (+) of a comparator 34, and the other end of the capacitor C1 is connected to the ground.

The switch S8 performs a switching operation according to the sampling signal SP1. For example, the switch S8 may be turned on by the sampling signal SP1 at a high level, the voltage VCT1 is sampled in the capacitor C1 during a period in which the switch S8 is turned on, and the voltage VTY is determined.

A buffer 33 is connected between the one end of the capacitor CT1 and one end of a switch S9, and the other end of the switch S9 is connected to an inverting terminal (−) of the comparator 34. The switch S9 performs a switching operation according to the signal TY. For example, the switch S9 is turned on by the signal TY at a high level, and the voltage VCT1 is input to the inverting terminal (−) of the comparator 34 during a period in which the switch S9 is turned on.

The comparator 34 generates the signal TTY at a high level when the input to the non-inverting terminal (+) is larger than the input to the inverting terminal (−), and generates the signal TTY at a low level in the case opposite to the above. Then, the comparator 34 may output the signal TTY at a high level during a period in which the voltage VCT1 is smaller than the voltage VTY, and may output the signal TTY at a low level during other periods.

A logic operation part 35 performs logical operations on the signal TTY and the signal TY to generate the signal TD1. Although the logic operation part 35 according to the embodiment is configured with an AND gate which performs an AND operation, the present disclosure is not limited thereto.

Hereinafter, an operation of a voltage multiplier according to the first embodiment will be described with reference to FIG. 3.

Figure 3:
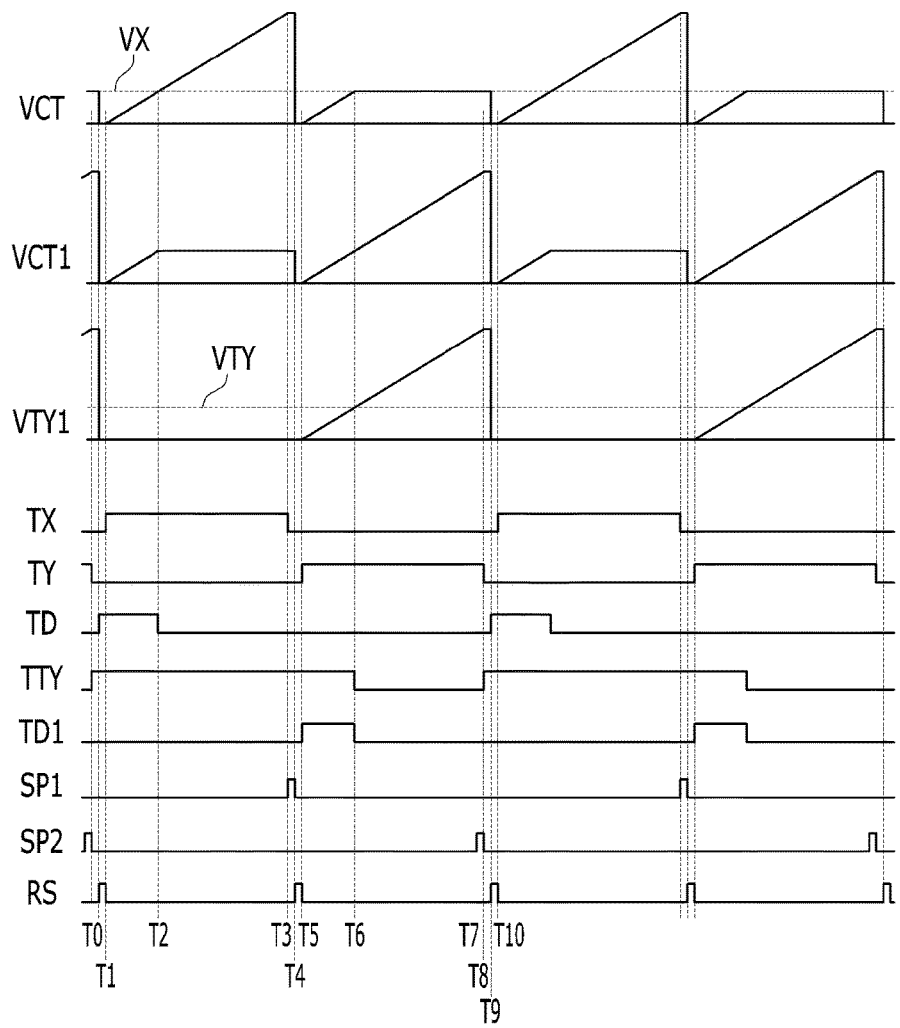
FIG. 3 is a timing diagram of the voltage multiplier according to the first embodiment.

FIG. 3 is a timing diagram of the voltage multiplier according to the first embodiment.

First, the reset signal RS rises at a time point T0, and the switch S10 and the switch S5 are turned on. Then, the voltage VCT and the voltage VCT1 are reset to the ground level, and the signal TD rises because the voltage VX is larger than the voltage VCT.

The reset signal RS drops to a low level at a time point T1 and the signal TX rises to a high level such that the switch S5 and the switch S10 are turned off and the switch S1 and the switch S2 are turned on. Then, the capacitor CT is charged by the current IX, and the voltage VCT increases. Furthermore, the switch S6 is turned on by the signal TD, the capacitor CT1 is charged by the current IT, and the voltage VCT1 also increases.

At a time point T2, the voltage VCT that is increasing reaches the voltage VX and the signal TD drops. Then, the switch S6 is turned off, and the voltage VCT1 remains constant by the capacitor CT1.

At a time point T3, the signal TX drops to a low level, and the sampling signal SP1 rises to a high level. Then, the switch S1 and the switch S2 are turned off, and the switch S8 is turned on. The voltage VCT1 is sampled by being transmitted to the capacitor C1 via the buffer 32 and the switch S8, and the sampled voltage VTY is maintained by the capacitor C1. A level of the voltage VTY before the time point T3 is a voltage sampled according to the sampling signal SP1 before the time point T0.

At a time point T4, the sampling signal SP1 drops to a low level, and the reset signal RS rises to a high level. Then, the switch S8 is turned off, and the switch S5 and the switch S10 are turned on. The voltage VCT and the voltage VCT1 are reset to the ground level.

At a time point T5, the reset signal RS drops to a low level, and the signal TY rises to a high level. The switch S5 and the switch S10 are turned off, and the switch S7 is turned on. The current IT charges the capacitor CT1 during the period in which the switch S7 is turned on, and the voltage VCT1 increases. The voltage VCT1 is supplied to the non-inverting terminal (−) of the comparator 34 via the buffer 33 and the switch S9. Furthermore, the signal TD1 rises due to being synchronized with a rising edge of the signal TY at the time point T5.

At a time point T6, when the voltage VCT1 reaches the voltage VTY, the signal TTY drops to a low level, and the signal TD1 drops due to being synchronized with a falling edge of the signal TTY.

At a time point T7, the sampling signal SP2 rises to a high level, and the switch S4 is turned on. The voltage VCT is sampled by being transmitted to the capacitor CM via the buffer 12 and the switch S4, and the sampled voltage VM is maintained by the capacitor CM.

At a time point T8, the sampling signal SP2 drops to a low level, and the signal TY drops to a low level. Then, the switch S4, the switch S7, and the switch S9 are turned off.

At a time point T9, the reset signal RS rises to a high level. Then, the switch S10 and the switch S5 are turned on, and the voltage VCT and the voltage VCT1 are reset to the ground level. Furthermore, the signal TD rises to a high level at the time point T9.

At a time point T10, the reset signal RS drops to a low level, and the signal TX rises to a high level. The switch S5 and the switch S10 are turned off, and the switch S1 and the switch S2 are turned on. The operations described above are repeated.

A high-level period P1 of the signal TD is substantially the same as a period in which the voltage VCT which is rising by the current IX reaches the voltage VX. In FIG. 3, the reset signal RS is a short pulse, and periods between rising edge time points T0, T4, and T9 and falling edge time points T1, T5, and T10 of the reset signal RS are very short periods. The period P1 may be represented by ((capacitance of CT)/IX)*VX. A high-level period of the signal TD1 generated by the time copier 30 is also the same as the period P1.

Then, since the voltage VM is IY*P1/(capacitance of CT), IY is VY/RY, and P1 is ((capacitance of CT)/IX)*VX, the voltage VM is as Equation 1 below. As shown in Equation 1, the capacitance is eliminated, and only the terms the voltage VX, the voltage VY, the current IX, and the resistance RY remain.

$$VM=VX*VY/(IX*RY)$$ [Equation 1]

Here, IX and RY are constant values, and the voltage VM is determined according to the voltage VX and the voltage VY.

In the related art, since a capacitor charged by the current IX and a capacitor charged by the current IY are separately provided, there is a problem in which the voltage VM is changed by each of capacitances of the two capacitors. However, the voltage multiplier 1 according to the embodiment has only one capacitor charged by the current IX and the current IY, and thus can solve the problem in which the voltage VM is changed due to a capacitance. Then, a process of having to adjust a capacitance to adjust a range of the voltage VM may also be omitted.

Hereinafter, a time copier according to a second embodiment will be described with reference to FIG. 4.

Figure 4:
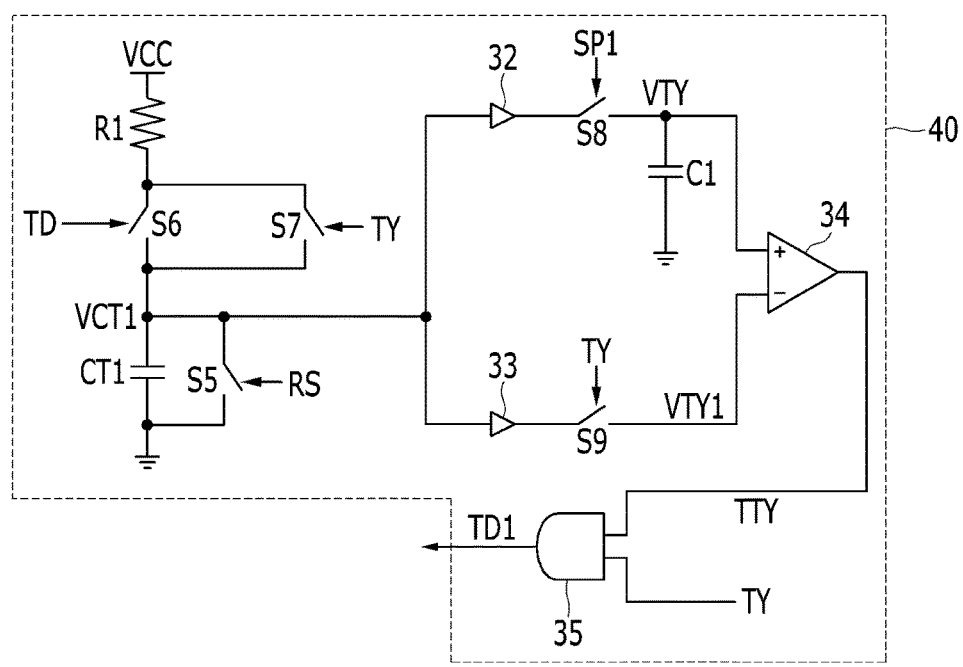
FIG. 4 is a view illustrating a time copier according to a second embodiment.

FIG. 4 is a view illustrating the time copier according to the second embodiment.

Like reference numerals will be used for like elements compared to the first embodiment described above, and detailed descriptions thereof will be omitted.

Compared to the first embodiment, a time copier 40 of the second embodiment uses the resistance R1 instead of the current source 31. The resistance R1 is connected between a voltage VCC and the switch S6 and the switch S7.

The capacitor CT1 is charged by the voltage VCC during the period in which the switch S6 is turned on by the signal TD and the period in which the switch S7 is turned on by the signal TY. The voltage VCT1 may increase by a time constant determined by the resistance R1 and the capacitor CT.

Although a voltage multiplier has been described as an example of an analog signal calculator so far, the present disclosure is not limited thereto. A time divider, which is still another example, will be described with reference to FIGS. 5 to 10.

Figure 5:
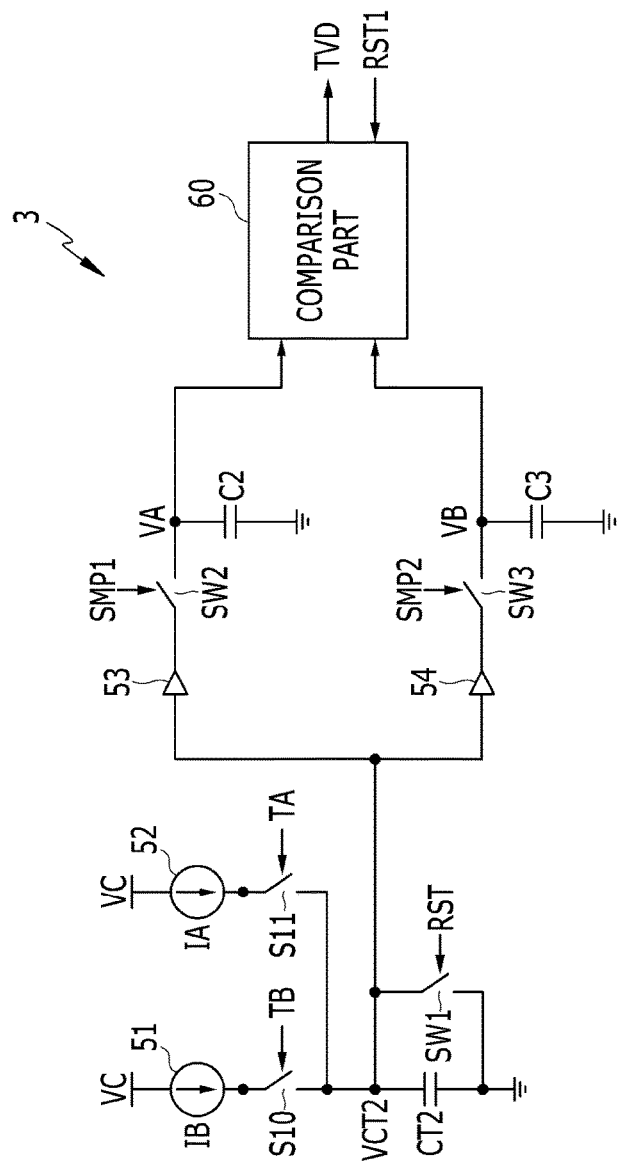
FIG. 5 is a view illustrating a time divider according to a third embodiment.

FIG. 5 is a view illustrating a time divider according to a third embodiment.

As illustrated in FIG. 5, a time divider 3 samples a voltage VA and a voltage VB respectively corresponding to a signal TA and a signal TB which represent a first time and a second time, and generates a signal TVD based on a result of comparing voltages which are increased by slopes on the basis of the voltage VB and the voltage VA.

A current source 51 uses the voltage VC to generate a current IB, and the switch S10 is connected between the current source 51 and one end of a capacitor CT2. A current source 52 uses the voltage VC to generate a current IA, and a switch S11 is connected between the current source 52 and the one end of the capacitor CT2. A switch SW1 is connected in parallel to both ends of the capacitor CT2.

The switch S10 performs a switching operation according to the signal TB, the switch S11 performs a switching operation according to the signal TA, and the switch SW1 performs a switching operation according to a reset signal RST1. For example, the switch S10 may be turned on by the signal TB at a high level, the switch S11 may be turned on by the signal TA at a high level, and the switch SW1 may be turned on by the reset signal RST1 at a high level.

The capacitor CT2 is charged by the current IB during a period in which the switch S10 is turned on, and a voltage VCT2 increases. The capacitor CT2 is charged by the current IA during a period in which the switch S11 is turned on, and the voltage VCT2 increases. When the switch SW1 is turned on, the capacitor CT2 may be discharged, and the voltage VCT2 may be reset to the ground level.

A buffer 53 is connected between the one end of the capacitor CT2 and one end of a switch SW2, and the other end of the switch SW2 is connected to one end of a capacitor C2. The switch SW2 performs a switching operation according to a sampling signal SMP1. For example, when the switch SW2 is turned on by the sampling signal SMP1 at a high level, the voltage VCT2 is sampled in the capacitor C2. The voltage VA sampled in the capacitor C2 is input to a comparison part 60.

A buffer 54 is connected between the one end of the capacitor CT2 and one end of a switch SW3, and the other end of the switch SW3 is connected to one end of a capacitor C3. The switch SW3 performs a switching operation according to a sampling signal SMP2. For example, when the switch SW3 is turned on by the sampling signal SMP2 at a high level, the voltage VCT2 is sampled in the capacitor C3. The voltage VB sampled in the capacitor C3 is input to the comparison part 60.

The comparison part 60 generates the signal TVD according to a period in which a voltage VCT3 which is increased according to a current on the basis of the voltage VA reaches the voltage VB. The comparison part 60 may reset the voltage VCT3 according to the reset signal RST1.

The comparison part 60 will be described with reference to FIG. 6.

Figure 6:
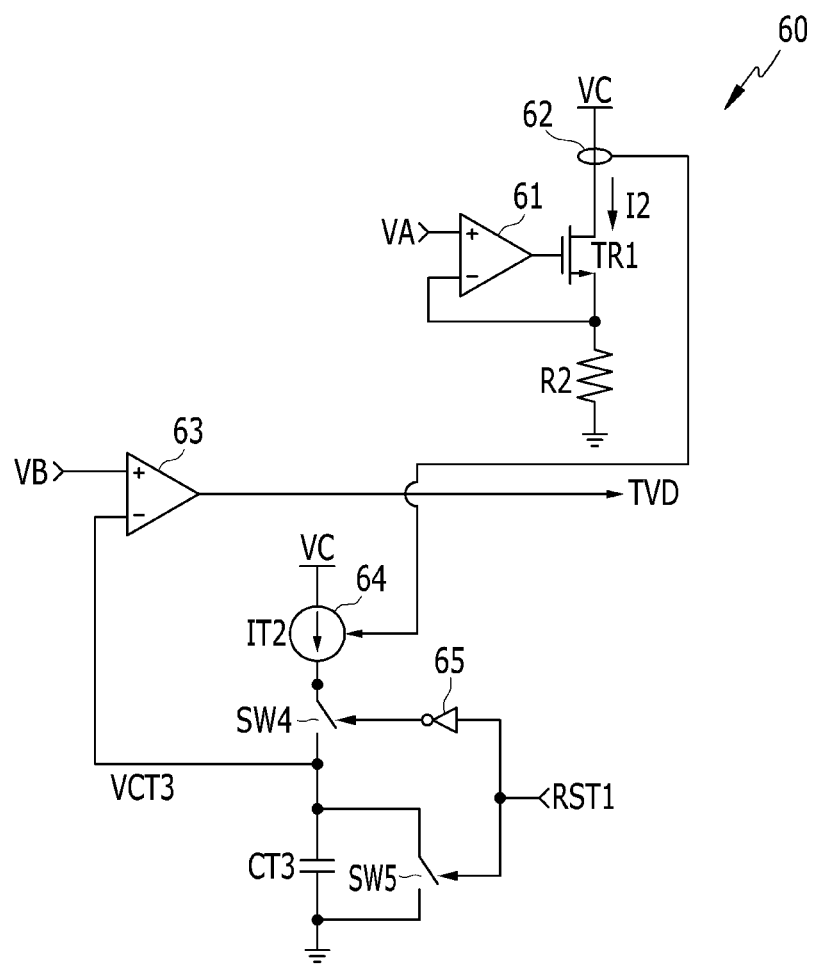
FIG. 6 is a view illustrating a comparison part.

FIG. 6 is a view illustrating a comparison part.

As illustrated in FIG. 6, the comparison part 60 generates a current I2 according to the voltage VA, and generates the voltage VCT3 by charging a capacitor CT3 by a current IT2 which is a copy of the current I2. The comparison part 60 generates the signal TVD having a high level during a period from a time point at which the voltage VCT3 starts to increase up to a time point at which the voltage VCT3 reaches the voltage VB.

The voltage VA is input to an input terminal (+) of an error amplifier 61, and the other input terminal (−) of the error amplifier 61 is connected to one end of a resistance R2. An output terminal of the error amplifier 61 is connected to a gate of a transistor TR1, a drain of the transistor TR1 is connected to a current mirror 62, and a source of the transistor TR1 is connected to the one end of the resistance R2.

The current mirror 62 and the transistor TR1 are biased by the voltage VC, and the current I2 flowing in the transistor TR1 is copied by the current mirror 62 and transmitted to a current source 64. The current source 64 generates the current IT2 according to the current transmitted from the current mirror 62.

The error amplifier 61 determines an output so that the voltage VA at the input terminal (+) and the voltage at the other input terminal (−) are equal. The transistor TR1 controls the current I2 according to the output of the error amplifier 61. The voltage at the other input terminal (−) of the error amplifier 61 is determined by the product of the current I2 and the resistance R2. Then, the current I2 is controlled to a value of VA/R2.

A switch SW4 is connected between the current source 64 and the capacitor CT3 and performs a switching operation according to the reset signal RST1 inverted by an inverter 65. A switch SW5 is connected in parallel to both ends of the capacitor CT3 and performs a switching operation according to the reset signal RST1.

For example, by the reset signal RST1 being at a high level, the switch SW5 is turned on and the switch SW4 is turned off. Conversely, by the reset signal RST1 being at a low level, the switch SW5 is turned off and the switch SW4 is turned on. The capacitor CT3 is charged by the current IT2 during a period in which the switch SW4 is turned on, and the voltage VCT3 increases.

A comparator 63 generates the signal TVD according to a result of comparing the voltage VCT3 with the voltage VB. The voltage VCT3 may be input to an inverting terminal (−) of the comparator 63, and the voltage VB may be input to a non-inverting terminal (+) of the comparator 63. The comparator 63 generates the signal TVD at a high level when the input to the non-inverting terminal (+) is larger than the input to the inverting terminal (−), and generates the signal TVD at a low level in the case opposite to the above.

Then, the comparator 63 may generate the signal TVD at a high level from a time point at which the voltage VCT3 starts to rise to a time point at which the voltage VCT3 reaches the voltage VB, and may output the signal TVD at a low level during a period in which the voltage VCT3 is higher than the voltage VB.

The period for the voltage VCT3 to reach the voltage VB, i.e. a period TDP in which the signal TVD has a high level, is VB*(capacitance of CT3)/IT2. Here, when assuming the current I2 and the current IT2 are equal, the period TDP may be represented as VB*(capacitance of CT3)*R2/VA.

Since the voltage VA is IA*(high-level period of TA_first time)/(capacitance of CT2) and the voltage VB is IB*(high-level period of TB_second time)/(capacitance of CT2), the period TDP may be shown as Equation 2 below.

$$TDP=(IB/IA)*(\text{capacitance of } CT3)*R2*(\text{second time/first time}) \quad \text{[Equation 2]}$$

Here, IA, IB, the capacitance of CT3, and R2 are all fixed values, and the period TDP is determined according to a value resulting from dividing the second time by the first time.

Hereinafter, an operation of the time divider according to the third embodiment will be described with reference to FIG. 7.

Figure 7:
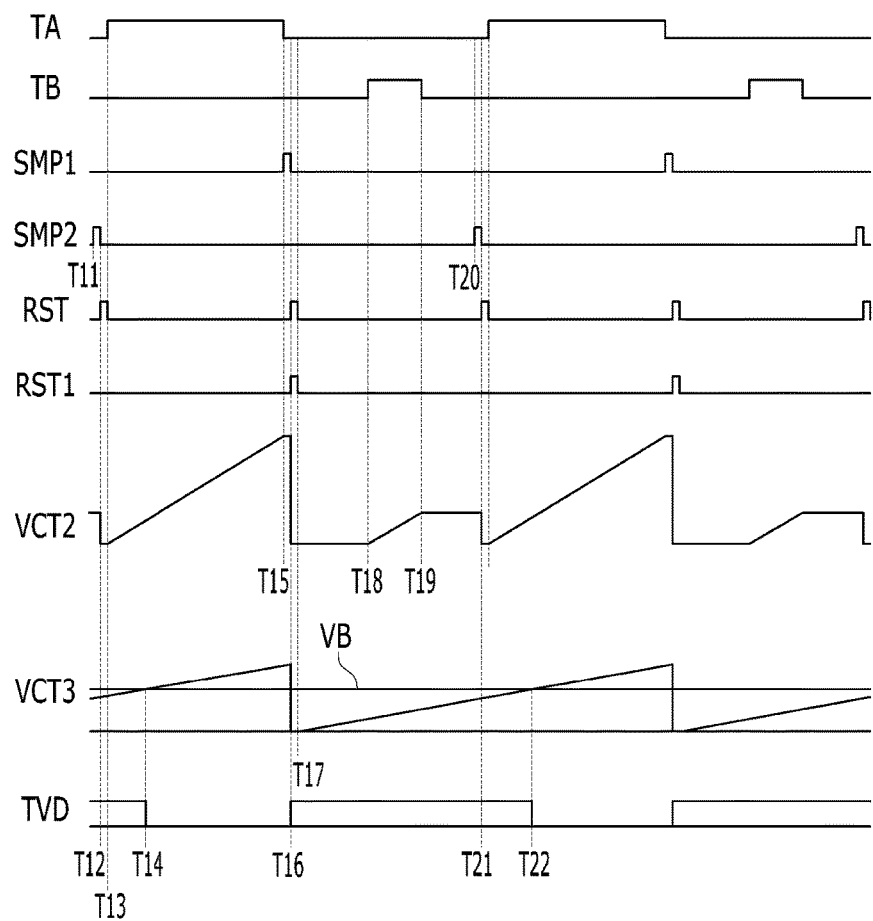
FIG. 7 is a waveform diagram of the time divider according to the third embodiment.

FIG. 7 is a waveform diagram of the time divider according to the third embodiment.

The waveform diagram illustrated in FIG. 7 is an example for describing the third embodiment, but the present disclosure is not limited thereto.

At a time point T11, the sampling signal SMP2 rises to a high level. Then, the switch SW3 is turned on, the voltage VCT2 is sampled in the capacitor C3, and the voltage VB is determined. Although the voltage VB is illustrated to be constant in FIG. 7, this setting is for convenience of description only and the present disclosure is not limited thereto. By being synchronized with a rising edge of the sampling signal SMP2, the voltage VB may be changed according to the high-level period (the second time) of the signal TB.

At a time point T12, the sampling signal SMP2 drops to a low level, and a reset signal RST rises to a high level. Then, the switch SW1 is turned on and the voltage VCT2 is reset to the ground level.

At a time point T13, the reset signal RST drops to a low level, and the signal TA rises to a high level. Then, the switch S11 is turned on and the switch SW1 is turned off such that the capacitor CT2 is charged by the current IA and the voltage VCT2 increases. Although a falling edge of the reset signal RST and a rising edge of the signal TA are illustrated to be at the same time points in FIG. 7, this is merely an example, and the present disclosure is not limited thereto. The voltage VCT2 increases from a time point at which the switch S11 is turned on by the signal TA.

At a time point T14, the voltage VCT3 that is increasing reaches the voltage VB, and the signal TVD drops to a low level.

At a time point T15, the signal TA drops to a low level, and the sampling signal SMP1 rises to a high level. The switch S11 is turned off and the switch SW2 is turned on such that the voltage VCT2 is sampled in the capacitor C2 and the voltage VA is determined. After the time point T15, the current IT2 is determined according to the voltage VA sampled at the time point T15.

At a time point T16, the sampling signal SMP1 drops to a low level, and the reset signal RST and the reset signal RST1 rise to a high level. Then, the switch SW2 and the switch SW4 are turned off, and the switch SW5 and the switch SW1 are turned on. The voltage VCT2 and the voltage VCT3 are reset to the ground level. The signal TVD rises to a high level.

At a time point T17, the reset signal RST and the reset signal RST1 drops to a low level, and the switch SW1 and the switch SW5 are turned off. In addition, the switch SW4 is turned on, the capacitor CT3 is charged by the current IT2, and the voltage VCT3 increases.

At a time point T18, the signal TB rises to a high level, and the switch S10 is turned on. At a time point T19, the signal TB drops to a low level, and the switch S10 is turned off. Then, the capacitor CT2 is charged by the current IB and the voltage VCT2 increases during the period T18-T19, and the voltage VCT2 is maintained after the time point T19.

At a time point T20, the sampling signal SMP2 rises to a high level and the switch SW3 is turned on. Then, the voltage VCT2 that increased during the period T18-T19 is sampled in the capacitor C3 and the voltage VB is determined.

At a time point T21, the sampling signal SMP2 drops to a low level, and the reset signal RST rises to a high level. Then, the voltage VCT2 is reset to the ground level. Operations afterwards are the same as that after the time point T11 described above.

At a time point T22, the voltage VCT3 reaches the voltage VB, the signal TVD has a high level in a period T16-T22, and the period depends on a value resulting from dividing the second period by the first period.

Although two sampling signals have been used in the third embodiment, a time divider may also be implemented using one sampling signal. A time divider 4 according to a fourth embodiment uses one sampling signal and further includes two capacitors.

Figure 8:
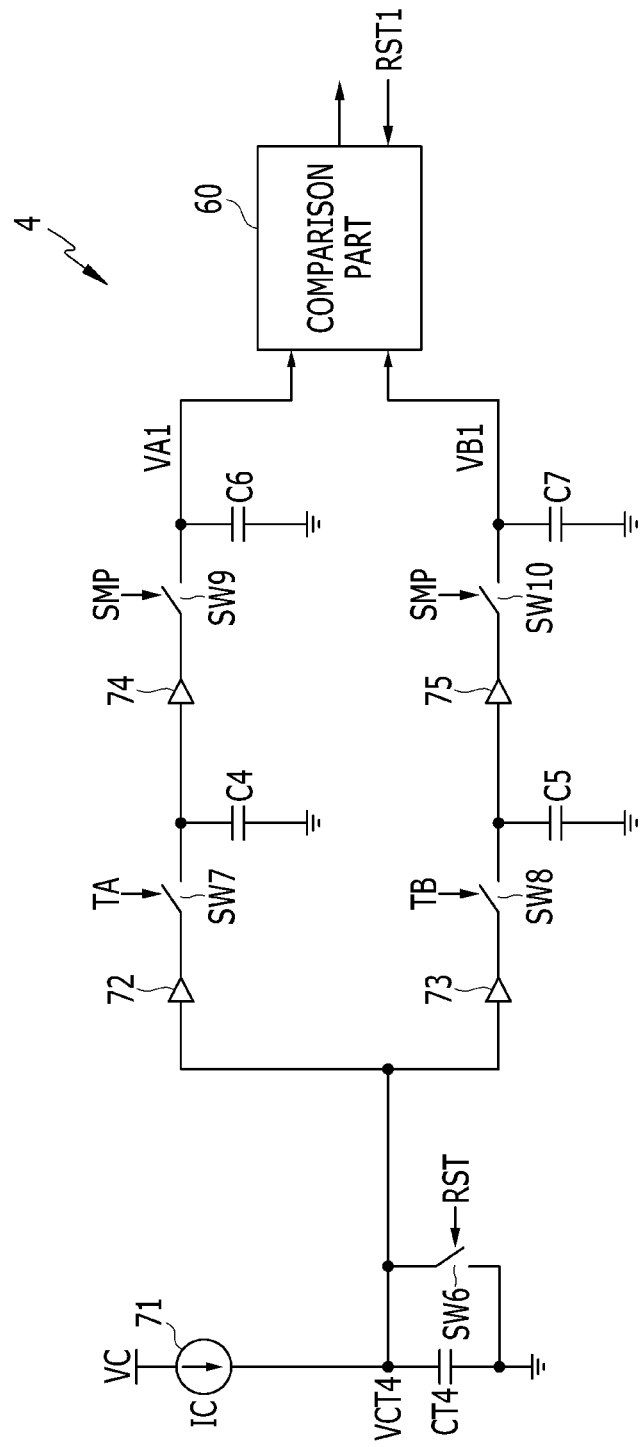
FIG. 8 is a view illustrating a time divider according to a fourth embodiment.

FIG. 8 is a view illustrating a time divider according to the fourth embodiment.

In the time divider 4, one current source 71 uses the voltage VC to generate a current IC and is connected to one end of a capacitor CT4, and the capacitor CT4 is charged by the current IC. Since the one current source 71 is used, a process of having to adjust currents between current sources may be omitted.

A switch SW6 is connected in parallel to both ends of the capacitor CT4 and performs a switching operation according to the reset signal RST. For example, the switch SW6 is turned on by the reset signal RST at a high level, the capacitor CT4 is discharged, and a voltage VCT4 is reset to the ground level.

A buffer 72 is connected between the one end of the capacitor CT4 and one end of a switch SW7, and the other end of the switch SW7 is connected to one end of a capacitor C4. A buffer 74 is connected between the one end of the capacitor C4 and one end of a switch SW9, and the other end of the switch SW9 is connected to one end of a capacitor C6.

The switch SW7 performs a switching operation according to the signal TA, and the switch SW9 performs a switching operation according to a sampling signal SMP. For example, the switch SW7 is turned on by the signal TA at a high level, and the switch SW9 is turned on by the sampling signal SMP at a high level.

The voltage VCT4 is transmitted to the capacitor C4 during a period in which the switch SW7 is turned on. A voltage charged in the capacitor C4 is sampled in the capacitor C6 at a time point at which the switch SW9 is turned on, and a voltage VA1 is determined.

A buffer 73 is connected between the one end of the capacitor CT4 and one end of a switch SW8, and the other end of the switch SW8 is connected to one end of a capacitor C5. A buffer 75 is connected between the one end of the capacitor C5 and one end of a switch SW10, and the other end of the switch SW10 is connected to one end of a capacitor C7.

The switch SW8 performs a switching operation according to the signal TB, and the switch SW10 performs a switching operation according to the sampling signal SMP. For example, the switch SW8 is turned on by the signal TB at a high level, and the switch SW10 is turned on by the sampling signal SMP at a high level.

The voltage VCT4 is transmitted to the capacitor C5 during a period in which the switch SW8 is turned on. A voltage charged in the capacitor C5 is sampled in the capacitor C7 at a time point at which the switch SW10 is turned on, and a voltage VB1 is determined.

The comparison part 60 is configured in the same way as the comparison part 60 of the third embodiment and receives the voltage VA1 instead of the voltage VA and the voltage VB1 instead of the voltage VB to generate the signal TVD.

Figure 9:
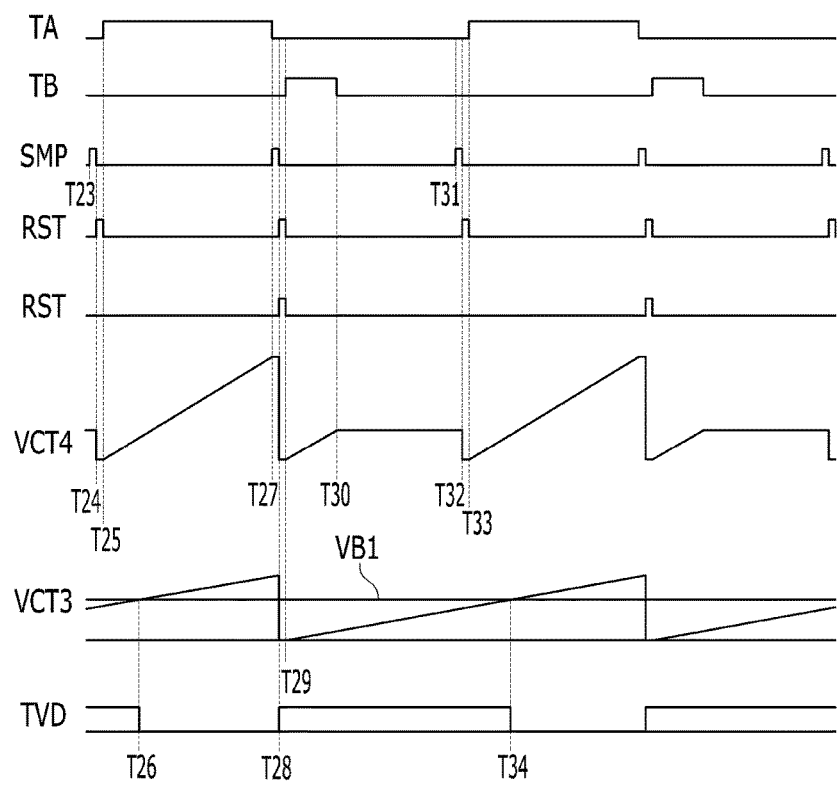
FIG. 9 is a waveform diagram of the time divider according to the fourth embodiment.

FIG. 9 is a waveform diagram of the time divider according to the fourth embodiment.

The waveform diagram illustrated in FIG. 9 is an example for describing the fourth embodiment, and the present disclosure is not limited thereto.

At a time point T23, the sampling signal SMP rises to a high level. Then, the switch SW9 and the switch SW10 are turned on, voltages of the capacitor C4 and the capacitor C5 are sampled in the capacitor C6 and the capacitor C7, respectively, and the voltage VA1 and the voltage VB1 are determined. Although the voltage VB1 is illustrated to be constant in FIG. 9, this setting is for convenience of description only and the present disclosure is not limited thereto. By being synchronized with a rising edge of the sampling signal SMP, the voltage VA1 and the voltage VB1 may change according to the high-level periods (the first time and the second time) of the signal TA and the signal TB, respectively.

At a time point T24, the sampling signal SMP drops to a low level, and the reset signal RST rises to a high level. Then, the switch SW6 is turned on and the voltage VCT4 is reset to the ground level.

At a time point T25, the reset signal RST drops to a low level, and the signal TA rises to a high level. Then, the switch SW6 is turned off, the capacitor CT4 is charged by the current IC, and the voltage VCT4 increases. In addition, the switch SW7 is turned on, and the capacitor C4 is charged by the voltage VCT4. Although a falling edge of the reset signal RST and a rising edge of the signal TA are illustrated to be at the same time points in FIG. 9, the present disclosure is not limited thereto. The capacitor C4 is charged by the voltage VCT4 from the rising edge of the signal TA.

At a time point T26, the voltage VCT3 that is increasing reaches the voltage VB1, and the signal TVD drops to a low level.

At a time point T27, the signal TA drops to a low level, and the sampling signal SMP rises to a high level. The switch SW7 is turned off and the switch SW9 is turned on such that a voltage charged in the capacitor C4 is transmitted to the capacitor C6 via the buffer 74 and sampled, and the voltage VA1 is determined. After the time point T27, the current IT2 is determined by the voltage VA1 sampled at the time point T24. Although the switch SW10 is also turned on at the time point T27, the voltage VB1 may not change since the voltage charged in the capacitor C5 is equal to the voltage at the time point T23.

At a time point T28, the sampling signal SMP drops to a low level, and the reset signal RST and the reset signal RST1 rise to a high level. Then, the switch SW4, the switch SW9, and the switch SW10 are turned off, and the switch SW5 and the switch SW6 are turned on. The voltage VCT4 and the voltage VCT2 are reset to the ground level. At the time point T28, the signal TVD rises to a high level.

At a time point T29, the reset signal RST and the reset signal RST1 drop to a low level, the switch SW6 and the switch SW5 are turned off, and the switch SW4 is turned on. Then, the capacitor CT4 is charged by the current IC from the time point T29 such that the voltage VCT4 increases, and the capacitor CT3 is charged by the current IT2 such that the voltage VCT2 increases.

Although the signal TB is illustrated in FIG. 9 as rising at the time point T29 and dropping at a time point T30, the present disclosure is not limited thereto.

The switch SW8 is turned on by the signal TB at the time point T29, and the switch SW8 is turned off by the signal TB at the time point T30. During the period T29-T30, the capacitor CT4 is charged by the current IC such that the voltage VCT4 increases, and the capacitor C5 is charged by the voltage VCT4. After the time point T30, the switch SW8 is turned off, and a voltage charged in the capacitor C5 is maintained.

At a time point T31, the sampling signal SMP rises to a high level and the switch SW10 is turned on. Then, the voltage charged in the capacitor C5 is sampled in the capacitor C7, and the voltage VB1 is determined.

At a time point T32, the sampling signal SMP drops to a low level, and the reset signal RST rises to a high level. Then, the voltage VCT4 is reset to the ground level. Operations afterwards are the same as that after the time point T23 described above.

At a time point T34, the voltage VCT3 reaches the voltage VB1, the signal TVD has a high level in a period T28-T34, and the period depends on a value resulting from dividing the second period by the first period.

In addition, when the current IA and the current IB of the current source 51 and the current source 52 illustrated in FIG. 5 are equal, a time divider may be implemented using one current source.

Figure 10:
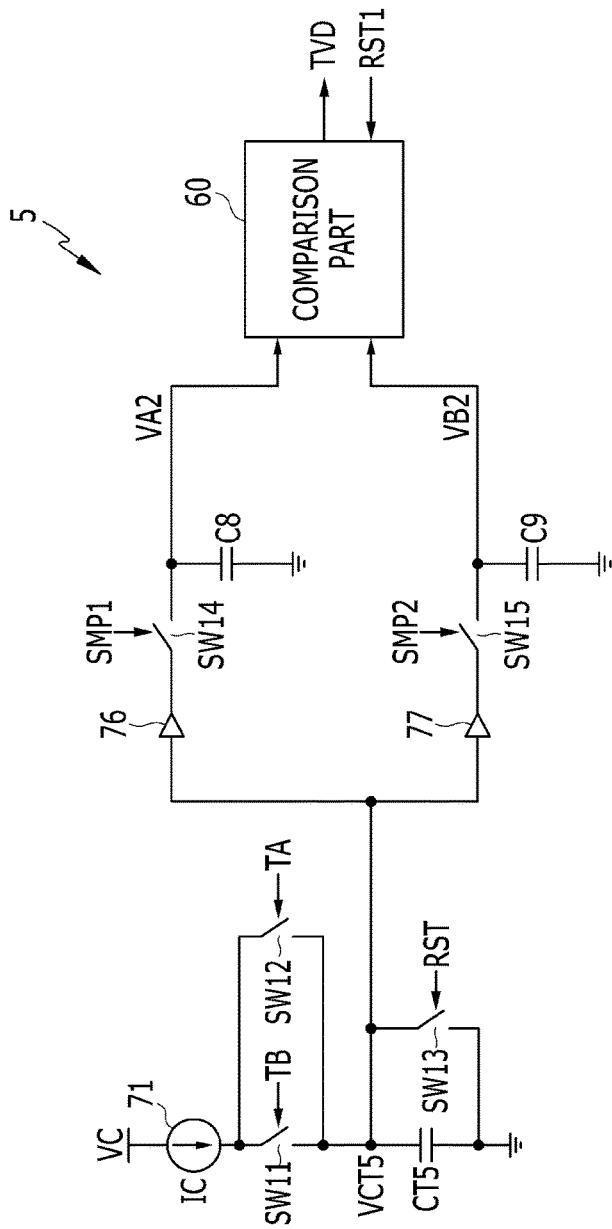
FIG. 10 is a view illustrating a time divider according to a fifth embodiment.

FIG. 10 is a view illustrating a time divider according to a fifth embodiment.

Compared to the third embodiment illustrated in FIG. 5, a time divider 5 according to the fifth embodiment is different in that a switch SW11 and a switch SW12 are connected to the same current source 71.

During a period in which the switch SW12 is turned on by the signal TA at a high level, a capacitor CT5 is charged by the current IC and a voltage VCT5 increases. A switch SW14 is turned on by being synchronized with a rising edge of the sampling signal SMP1, the voltage VCT5 is sampled by a capacitor C8, and a voltage VA2 is determined.

During a period in which the switch SW11 is turned on by the signal TB at a high level, the capacitor CT5 is charged by the current IC and the voltage VCT5 rises. A switch SW15 is turned on by being synchronized with the rising edge of the sampling signal SMP2, the voltage VCT5 is sampled by a capacitor C9, and a voltage VB2 is determined.

The comparison part 60 is configured in the same way as the comparison part 60 of the third embodiment and receives the voltage VA2 instead of the voltage VA and the voltage VB2 instead of the voltage VB to generate the signal TVD.

In the related art, since a capacitor charged by the current IA and a capacitor charged by the current IB are separately provided, capacitances of the two capacitors have to be matched. A matching process is required since the voltage VA and the voltage VB must be determined only according to corresponding times.

However, one capacitor is used in the time dividers according to the third to fifth embodiments, and thus the matching process which is required in the related art is not required.

Until now, various embodiments in which at least one of a capacitor and a current source is shared in a signal calculator have been described. The present disclosure is not limited thereto and may be a signal calculator which samples a signal generated by one current source and one capacitor at least twice. The embodiments described above and embodiments below may be applied to a power supply. For example, the embodiments may be applied for generating a signal which controls a switching operation of a power supply.

Figure 11:
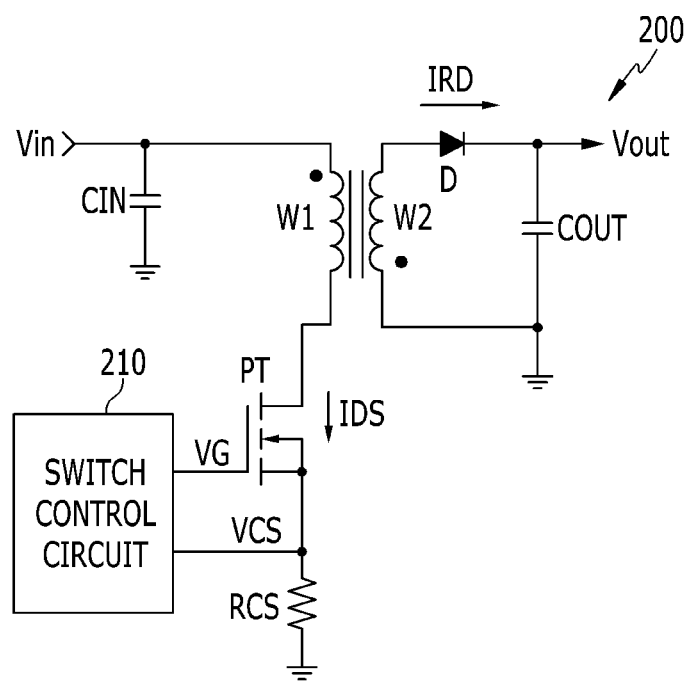
FIG. 11 is a view illustrating a power supply.

FIG. 11 is a view illustrating a power supply.

A power supply 200 includes a switch control circuit 210, a power switch PT, and a transformer formed of a first-side wiring W1 and a second-side wiring W2.

An input voltage VIN is supplied and a capacitor CIN is connected to one end of the first-side wiring W1. A drain of the power switch PT is connected to the other end of the first-side wiring W1, and a current detection resistance RCS is connected to a source of the power switch PT. A gate voltage VG supplied from the switch control circuit 210 is input to a gate of the power switch PT, and a switching operation is controlled according to the gate voltage VG.

A current IDS flowing during a period in which the power switch PT is turned on is detected by the resistance RCS, and a detected voltage VCS is generated. The switch control circuit 210 may use the detected voltage VCS to control a switching operation.

An anode of a rectifying diode D is connected to one end of the second-side wiring W2, and a cathode of the rectifying diode D is connected to an output terminal and one end of a capacitor COUT.

The current IDS flowing to the power switch PT via the first-side wiring W1 increases during the period in which the power switch PT is turned on, and in this case the rectifying diode D is in a non-conducting state. When the power switch PT is turned off, the rectifying diode D is conducted and a discharge current IRD flows. The discharge current IRD may be a waveform which decreases from a time point at which the power switch PT is turned off.

Figure 12:
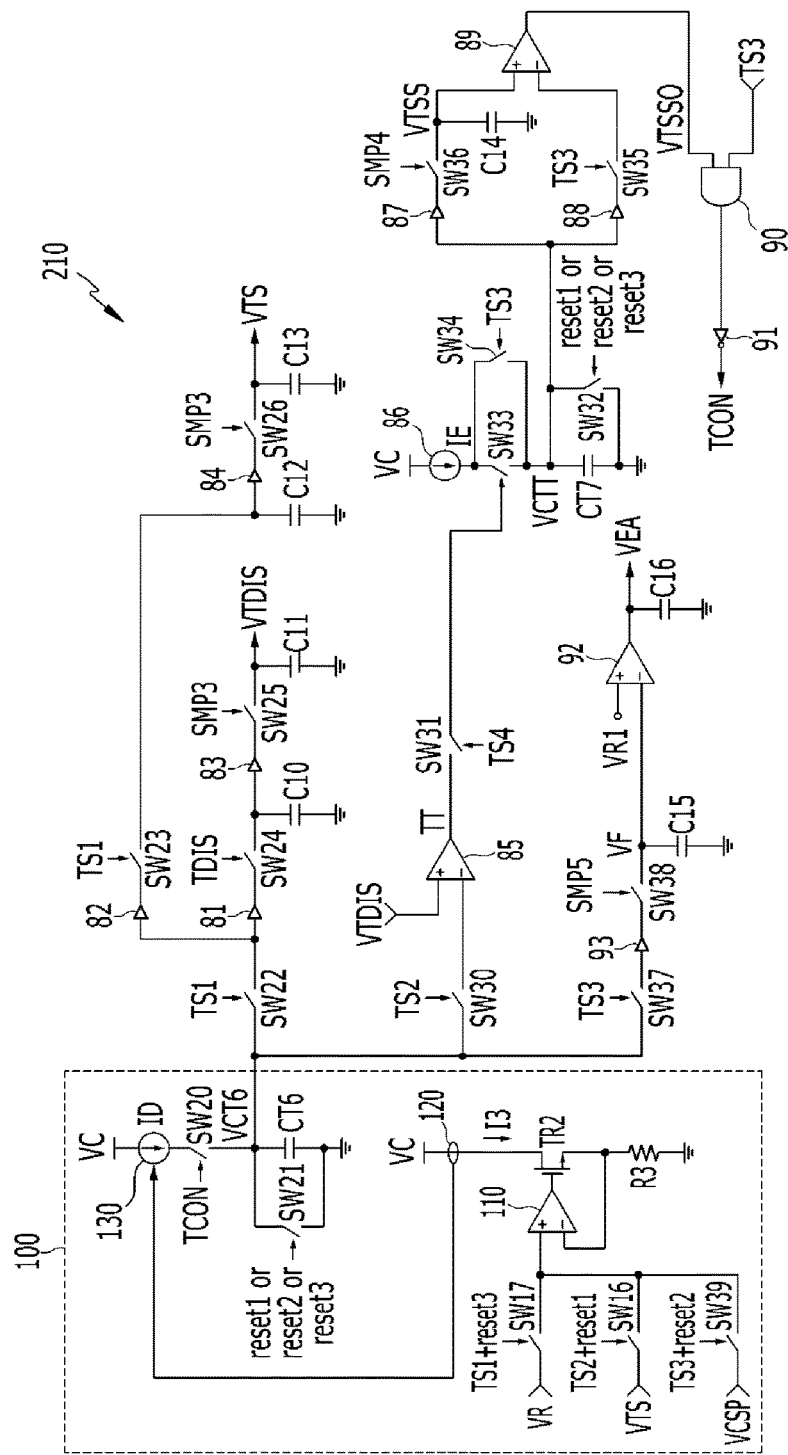
FIG. 12 is a view illustrating a switch control circuit including a signal calculator according to a sixth embodiment.

FIG. 12 is a view illustrating a switch control circuit including a signal calculator according to a sixth embodiment.

In FIG. 12, elements that configure a signal calculator are illustrated among elements of the switch control circuit 210. A signal generator 100 generates a current IT3 depending on a voltage selected from three voltages VREF, VTS, and VCSP every switching period, and charges a capacitor CT6 by the current IT3 to generate a voltage VCT6. The voltage VCT6 may be reset by at least one of reset signals reset1-reset3 every switching period.

The voltage VREF is supplied to one end of a switch SW17, and the other end of the switch SW17 is connected to an input terminal (+) of an error amplifier 110. The voltage VTS is supplied to one end of a switch SW16, and the other end of the switch SW16 is connected to the input terminal (+) of the error amplifier 110. The voltage VCSP is supplied to one end of a switch SW18, and the other end of the switch SW18 is connected to the input terminal (+) of the error amplifier 110. The voltage VCSP is a peak voltage of the detected voltage VCS.

The switch SW17 performs a switching operation according to a signal TS1 and the reset signal reset3. For example, the switch SW17 is turned on during a period in which at least one of the signal TS1 and the reset signal reset 3 has a high level, and the switch SW17 is turned off when both of the two signals have a low level. The switch SW16 performs a switching operation according to a signal TS2 and the reset signal reset1. For example, the switch SW16 is turned on during a period in which at least one of the signal TS2 and the reset signal reset 1 has a high level, and the switch SW16 is turned off when both of the two signals have a low level. The switch SW18 performs a switching operation according to a signal TS3 and the reset signal reset2. For example, the switch SW18 is turned on during a period in which at least one of the signal TS3 and the reset signal reset 2 has a high level, and the switch SW18 is turned off when both of the two signals have a low level.

The other input terminal (−) of the error amplifier 110 is connected to one end of a resistance R3 and a source of a transistor TR2, and an output terminal of the error amplifier 110 is connected to a gate of the transistor TR2. A drain of the transistor TR2 is connected to a current mirror 120, and the source of the transistor TR2 is connected to the one end of the resistance R1.

The current mirror 120 and the transistor TR2 are biased by the voltage VC, and a current I3 flowing in the transistor TR2 is copied by the current mirror 120 and transmitted to a current source 130. The current source 130 generates the current IT3 according to the current transmitted from the current mirror 120.

The error amplifier 110 determines an output so that a voltage at the input terminal (+) and a voltage at the other input terminal (−) are equal. The transistor TR2 controls the current I3 according to the output of the error amplifier 110. The voltage at the other input terminal (−) of the error amplifier 110 is determined by the product of the current I3 and the resistance R3. The current I3 is controlled to a value of VREF/R3 during a period in which the switch SW17 is turned on, the current I3 is controlled to a value of VTS/R3 during a period in which the switch SW16 is turned on, and the current I3 is controlled to a value of VCSP/R3 during a period in which the switch SW18 is turned on.

A switch SW20 is connected between the current source 130 and the capacitor CT6 and performs a switching operation according to a signal TCON. For example, the switch SW20 is turned on by the signal TCON at a high level, the capacitor CT6 is charged by the current IT3, and the voltage VCT6 increases.

A switch SW21 is connected in parallel to both ends of the capacitor CT6 and performs a switching operation according to the reset signals reset1-reset3. For example, the switch SW21 is turned on when at least one of the reset signals reset1-reset3 has a high level. When the switch SW21 is turned on, the capacitor CT6 may be discharged and the voltage VCT6 may be reset to the ground level. The switch SW21 is turned off when all of the reset signals reset1-reset3 have a high level, the capacitor CT6 is charged by the current IT3, and the voltage VCT6 increases.

One end of a switch SW22 is connected to one end of the capacitor CT6, a buffer 81 is connected between the other end of the switch SW22 and one end of a switch SW24, and the other end of the switch SW24 is connected to one end of a capacitor C10. A buffer 83 is connected between the one end of the capacitor C10 and one end of a switch SW25, and the other end of the switch SW25 is connected to one end of a capacitor C11.

The switch SW22 performs a switching operation according to the signal TS1, the switch SW24 performs a switching operation according to a signal TDIS, and the switch SW25 performs a switching operation according to a sampling signal SMP3. For example, the switch SW22 is turned on by the signal TS1 at a high level, the switch SW24 is turned on by the signal TDIS at a high level, and the switch SW25 may be turned on by the sampling signal SMP3 at a high level.

During a period in which the switch SW22 and the switch SW24 are turned on, the voltage VCT6 is transmitted to the capacitor C10 via the buffer 81. A voltage charged in the capacitor C10 is sampled in the capacitor C11 via the buffer 83 during a period in which the switch SW25 is turned on, and the voltage VTDIS is determined.

A buffer 82 is connected between the other end of the switch SW22 and one end of a switch SW23, and the other end of the switch SW22 is connected to one end of a capacitor C12. A buffer 84 is connected between the one end of the capacitor C12 and one end of a switch SW26, and the other end of the switch SW26 is connected to one end of a capacitor C13.

The switch SW23 performs a switching operation according to the signal TS1, and the switch SW26 performs a switching operation according to the sampling signal SMP3. For example, the switch SW23 is turned on by the signal TS1 at a high level, and the switch SW26 is turned on by the sampling signal SMP3 at a high level.

During a period in which the switch SW22 and the switch SW23 are turned on, the voltage VCT5 is transmitted to the capacitor C12 via the buffer 82. A voltage charged in the capacitor C12 is sampled in the capacitor C13 via the buffer 84 during a period in which the switch SW26 is turned on, and the voltage VTS is determined.

One end of a switch SW30 is connected to the one end of the capacitor CT6, and the other end of the switch SW30 is connected to an inverting terminal (−) of a comparator 85. The voltage VTDIS is input to a non-inverting terminal (+) of the comparator 85, and an output terminal of the comparator 85 is connected to one end of a switch SW31. The comparator 85 generates a signal TT at a high level when an input to the non-inverting terminal (+) is larger than an input to the inverting terminal (−), and generates the signal TT at a low level in the case opposite from the above.

The switch SW31 performs a switching operation according to the signal TS2, and the signal TT controls a switching operation of a switch SW33 during a period in which the switch SW31 is turned on. For example, the switch SW31 is turned on by the signal TS2 at a high level, and is turned off by the signal TS2 at a low level. Then, the switch SW33 performs a switching operation according to the signal TT during a high-level period of the signal TS2.

A current source 86 uses the voltage VC to generate a current ITT. One end of the switch SW33 is connected to the current source 86, one end of a capacitor CTT is connected to the other end of the switch SW33, and the other end of the capacitor CTT is connected to the ground.

The switch SW33 performs a switching operation according to the signal TT during a period in which the switch SW31 is turned on. For example, the switch SW33 is turned on by the signal TT at a high level, the capacitor CTT is charged by the current ITT during a period in which the switch SW33 is turned on, and a voltage VCTT increases.

Like the switch SW33, a switch SW34 is also connected between the current source 86 and a capacitor CT7. The switch SW34 performs a switching operation according to the signal TS3. For example, the switch SW34 is turned on by the signal TS3 at a high level, the capacitor CTT is charged by the current ITT during a period in which the switch SW34 is turned on, and the voltage VCTT increases.

A switch SW32 is connected in parallel to both ends of the capacitor CTT. The switch SW32 performs a switching operation according to the reset signals reset1-reset3. For example, the switch SW32 is turned on when at least one of the reset signals reset1-reset3 has a high level. When the switch SW32 is turned on, the capacitor CTT may be discharged, and the voltage VCTT may be reset to the ground level. The switch SW32 is turned off when all of the reset signals reset1-reset3 have a high level.

A buffer 87 is connected between the one end of the capacitor CTT and one end of a switch SW36, and the other end of the switch SW36 is connected to one end of a capacitor C14. The one end of the capacitor C14 is connected to a non-inverting terminal (+) of a comparator 89, and the other end of the capacitor C14 is connected to the ground.

The switch SW36 performs a switching operation according to a sampling signal SMP4. For example, the switch SW36 is turned on by the sampling signal SMP4 at a high level, the voltage VCTT is sampled in the capacitor C14 during a period in which the switch SW36 is turned on, and a voltage VTSS is determined.

A buffer 88 is connected between the one end of the capacitor CTT and one end of a switch SW35, and the other end of the switch SW35 is connected to an inverting terminal (−) of the comparator 89. The switch SW35 performs a switching operation according to the signal TS3. For example, the switch SW35 is turned on by the signal TS3 at a high level, and the voltage VCTT is input to the inverting terminal (−) of the comparator 89 during a period in which the switch SW35 is turned on.

The comparator 89 generates a signal VTSSO at a high level when an input to the non-inverting terminal (+) is larger than an input to the inverting terminal (−) and generates the signal VTSSO at a low level in the case opposite from the above. Then, the comparator 89 may output the signal VTSSO at a high level during a period in which the voltage VCTT is lower than the voltage VTSS, and may output the signal VTSSO at a low level during a period in which the voltage VCTT is higher than the voltage VTSS.

A logic operation part 90 performs logical operations on the signal VTSSO and the signal TS3 to generate a signal TD2. Although the logic operation part 90 according to the embodiment is configured with an AND gate with performs an AND operation, the present disclosure is not limited thereto.

An inverter 91 inverts the signal TD2 to generate the signal TCON.

One end of a switch SW37 is connected to one end of the capacitor CT6, and the other end of the switch SW37 is connected to an input terminal of a buffer 93. The switch SW37 performs a switching operation according to the signal TS3. For example, the switch SW37 is turned on by the signal TS3 at a high level, and is turned off by the signal TS3 at a low level.

One end of a switch SW38 is connected to an output terminal of the buffer 93, and the other end of the switch SW38 is connected to one end of a capacitor C15. The switch SW38 performs a switching operation according to a sampling signal SMP5. For example, the switch SW38 is turned on by the sampling signal SMP5 at a high level, and is turned off by the sampling signal SMP5 at a low level. During a period in which the switch SW37 is turned on, when the switch SW38 is turned on by the sampling signal SMP5 at a high level, the voltage VCT6 is stored in the capacitor C15 and sampled.

The one end of the capacitor C15 is connected to an inverting terminal (−) of an error amplifier 92, and a voltage VF sampled by the capacitor C15 is input to the inverting terminal (−) of the error amplifier 92.

A reference voltage VR1 is input to a non-inverting terminal (+) of the error amplifier 92, and a capacitor C16 is connected to an output terminal of the error amplifier 92. The error amplifier 92 outputs a result of amplifying a difference between the input to the non-inverting terminal (+) and the input to the inverting terminal (−). The output of the error amplifier 92 is compensated for by the capacitor C16, and an error voltage VEA is generated.

Hereinafter, an operation of the signal calculator according to the sixth embodiment will be described with reference to FIG. 13.

Figure 13:
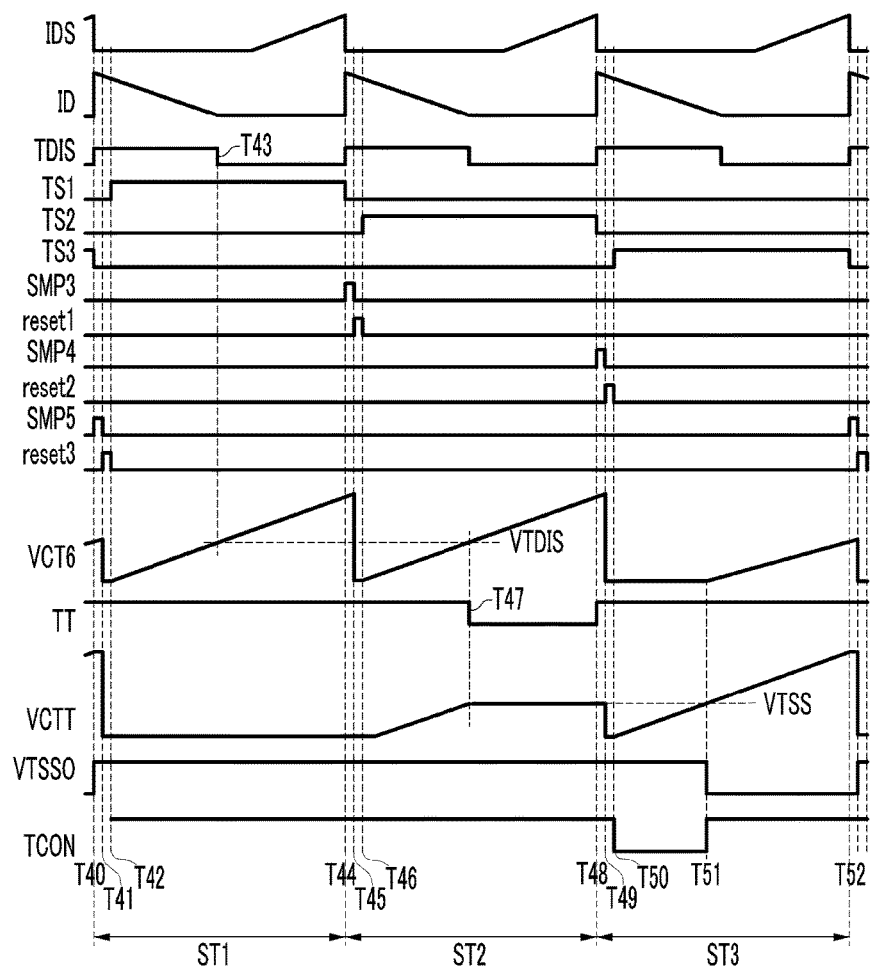
FIG. 13 is a view illustrating waveforms of signals of the signal calculator according to the sixth embodiment.

FIG. 13 is a view illustrating waveforms of signals of the signal calculator according to the sixth embodiment.

In FIG. 13, a voltage which controls the current source 130 is illustrated as being changed every switching period. For example, the current IT3 of the current source 130 is determined by the voltage VREF during a switching period ST1, the current IT3 of the current source 130 is determined by the voltage VTS during a switching period ST2, and the current IT3 of the current source 130 is determined by the voltage VCSP during a switching period ST3. From a period after the switching period ST3, the current IT3 of the current source 130 is determined by the voltage VREF again as in the switching period ST1.

In this manner, an operation of controlling the current source 130 is repeated every three switching periods based on the number of voltages VREF, VTS, and VCSP which control the current source 130. The present disclosure is not limited thereto, and a basic period of the operation of controlling the current source 130 is determined according to the number of voltages which control the current source 130. For example, when the number of voltages which control the current source 130 is two, the operation of controlling the current source 130 is repeated every two switching periods.

Every switching period, the current IDS increases during the period in which the power switch PT is turned on. At a time point T40, the power switch PT is turned off, a discharged current ID is generated, and the signal TDIS rises to a high level. The signal TDIS is a signal which represents a period in which the discharged current ID flows, and has a high level during a period T40-T43 in which the discharged current ID decreases.

At the time point T40, the sampling signal SMP5 rises to a high level, and the switch SW38 is turned on. By being synchronized with the time point T40, the signal TS3 drops to a low level, and the switch SW37 is turned off. At a time point when both of the switch SW37 and the switch SW38 are turned on, the voltage VCT6 is sampled in the capacitor C15, and the voltage VF is determined.

Although it has been described that both of the signal TS3 and the sampling signal SMP5 have a high level at the time point T40, the present disclosure is not limited thereto. Both of the two signals may have a high level during a predetermined period. For example, the sampling signal SMP5 may rise to a high level before the time point T40.

When the signal TS3 drops to a low level, the switch SW18, the switch SW34, and the switch SW35 are turned off. From the time point T40, the current ITT being supplied to the capacitor CTT is blocked due to the switch SW34 being turned off, the input to the inverting terminal (−) of the comparator 89 is blocked due to the switch SW35 being turned off, and the signal VTSSO rises to a high level.

At a time point T41, the sampling signal SMP5 drops to a low level, and the reset signal reset3 rises to a high level. Then, the switch SW21 is turned on, the voltage VCT6 is reset to the ground level by the discharge of the capacitor CT6, the switch SW17 is turned on, and the current source 130 begins to generate the current IT3 according to the voltage VREF.

In addition, the voltage VCTT remains constant during a period T40-T41, the switch SW32 is turned on at the time point T41, and the voltage VCTT is reset to the ground level by the discharge of the capacitor CTT.

At a time point T42, the reset signal reset3 drops to a low level, and the signal TS1 rises to a high level. The switches SW21 and SW32 are turned off, and the switches SW22 and SW23 are turned on. Then, the capacitor CT6 is charged by the current IT3 according to the voltage VREF, and the voltage VCT6 increases.

At a time point T43, the signal TDIS drops to a low level. The capacitor C10 is charged by the voltage VCT6 during a period T42-T43. At a time point T44, the signal TS1 drops to a low level. The capacitor C12 is charged by the voltage VCT6 during a period T42-T44.

At the time point T44, the power switch PT is turned off, the signal TS1 drops to a low level, the sampling signal SMP3 rises to a high level, the switches SW17, SW22, and SW23 are turned off, and the switches SW25 and SW26 are turned on. Then, a voltage charged in the capacitor C10 is sampled in the capacitor C11 such that the voltage VTDIS is determined, a voltage charged in the capacitor C12 is sampled in the capacitor C13 such that the voltage VTS is determined.

At a time point T45, the sampling signal SMP3 drops to a low level, and the reset signal reset1 rises to a high level. Then, the switch SW21 is turned on such that the voltage VCT6 is reset to the ground level by the discharge of the capacitor CT6, and the switch SW16 is turned on such that the current source 130 begins to generate the current IT3 according to the voltage VTS. At the time point T45, the switches SW25 and SW26 are turned off.

At a time point T46, the reset signal reset3 drops to a low level, the signal TS2 rises to a high level, the switches SW21 and SW32 are turned off, and the switches SW30 and SW31 are turned on. Then, the capacitor CT6 is charged by the current IT3 according to the voltage VTS, and the voltage VCT6 increases.

The comparator 85 outputs the signal TT according to a result of comparing the voltage VCT6 input via the switch SW30 with the voltage VTDIS. The comparator 85 outputs a high level when an input to the non-inverting terminal (+) is larger than an input to the inverting terminal (−), and outputs a low level when the input to the non-inverting terminal (+) is smaller than the input to the inverting terminal (−).

The voltage VCT6 increases from the time point T46 and reaches a level of the voltage VTDIS at a time point T47. Then, the comparator 85 outputs the signal TT at a high level during a period T46-T47 and outputs a low level from the time point T47.

Since the switch SW33 is turned on during the period T46-T47, the capacitor CTT is charged by the current ITT and the voltage VCTT increases. At the time point T47, the signal TT drops to a low level, and the switch SW33 is turned off. After the time point T47, a level of the voltage VCTT is maintained by the capacitor CTT.

At a time point T48, the power switch PT is turned off, the signal TS2 drops to a low level, the sampling signal SMP4 rises to a high level, the switches SW16, SW30, and SW31 are turned off, and the switch SW36 are turned on. Then, a voltage charged in the capacitor CTT is sampled in the capacitor C14 and the voltage VTSS is determined.

At a time point T49, the sampling signal SMP4 drops to a low level, and the reset signal reset2 rises to a high level. Then, the switch SW21 is turned on such that the voltage VCT6 is reset to the ground level by the discharge of the capacitor CT6, and the switch SW32 is turned on such that the voltage VCTT is reset to the ground level by the discharge of the capacitor CTT. The switch SW18 is turned on such that the current source 130 begins to generate the current IT3 according to the voltage VCSP. At the time point T49, the switch SW36 is turned off.

At a time point T50, the reset signal reset3 drops to a low level, the signal TS3 rises to a high level, the switches SW21 and SW32 are turned off, and the switches SW34, SW35, and SW37 are turned on. From the time point T50, the capacitor CTT is charged by the current ITT supplied via the switch SW34 which is turned on, and the voltage VCTT increases.

The comparator 87 outputs the signal VTSSO according to a result of comparing the voltage VCTT input via the switch SW35 with the voltage VTSS. The comparator 87 outputs a high level when an input to the non-inverting terminal (+) is larger than an input to the inverting terminal (−), and outputs a low level when the input to the non-inverting terminal (+) is smaller than the input to the inverting terminal (−).

The voltage VCTT increases from the time point T50 and reaches a level of the voltage VTSS at a time point T51. Since the switch SW35 is turned off during a period T40-T50, the comparator 87 outputs the signal VTSSO at a high level according to the voltage VTSS which is the input to the non-inverting terminal (+) of the comparator 87. In addition, since the input to the non-inverting terminal (+) of the comparator 87 is larger than the input to the inverting terminal (−) during a period T50-T51, the comparator 87 outputs the signal VTSSO at a high level. From the time point T51, the comparator 87 outputs the signal VTSSO at a low level.

The AND gate 90 outputs the signal TD2 at a high level from the time point T50 at which the signal TS3 begins to have a high level, the signal TD2 is inverted by the inverter 91, and the signal TCON drops to a low level. Then, from the time point T50, the switch SW20 is turned off.

From the time point T51, the signal VTSSO begins to have a low level such that the signal TD2, which is the output of the AND gate 90, begins to have a low level, the signal TD2 is inverted by the inverter 91, and the signal TCON rises to a high level. Then, from the time point T51, the switch SW20 is turned on, the capacitor CT6 is charged by the current IT3 according to the voltage VCSP, and the voltage VCT6 increases.

At a time point T52, the sampling signal SMP5 rises to a high level, and the switch SW38 is turned on. Here, the voltage VCT6 is sampled by the capacitor C15. The error amplifier 92 amplifies a difference between the reference voltage VR1 and the voltage VF sampled in the capacitor C15 to generate the error voltage VEA. The error voltage VEA may be compensated for by the capacitor C16.

By being synchronized with the time point T52, the signal TS3 drops to a low level, and the switches SW18, SW35, and SW37 are turned off. The comparator 89 outputs the signal VTSSO at a high level according to the signal VTSS input to the non-inverting terminal (+) from the time point T52. The AND gate 90 maintains an output at a low level since the signal TS3 has a low level from the time point T52, and the signal TCON is also maintained at a high level.

Then, the operations during a period T40-T52 described above are repeated. For example, the operations during the period T40-T52 are repeated from the time point T52 of a switching period after the switching period ST3.

For describing the sixth embodiment, although high-level periods of the sampling signals SMP3-SMP5 and the reset signals reset1-reset3 are illustrated in FIG. 13, the high-level periods are very short periods. For example, the sampling signals SMP3-SMP5 and the reset signals reset1-reset3 may be implemented with short pulses, and rising edges and falling edges may not be differentiated in time.

The current source 130 according to the sixth embodiment generates a current according to one voltage among the three voltages corresponding to each of the three switching periods. The present disclosure is not limited thereto, and the number of the switching periods may be determined according to the number of voltages which control the current source 130.

Hereinafter, a seventh embodiment including a current source which generates a current according to one voltage of two voltages corresponding to each of two switching periods will be described with reference to FIGS. 14 and 15.

Figure 14:
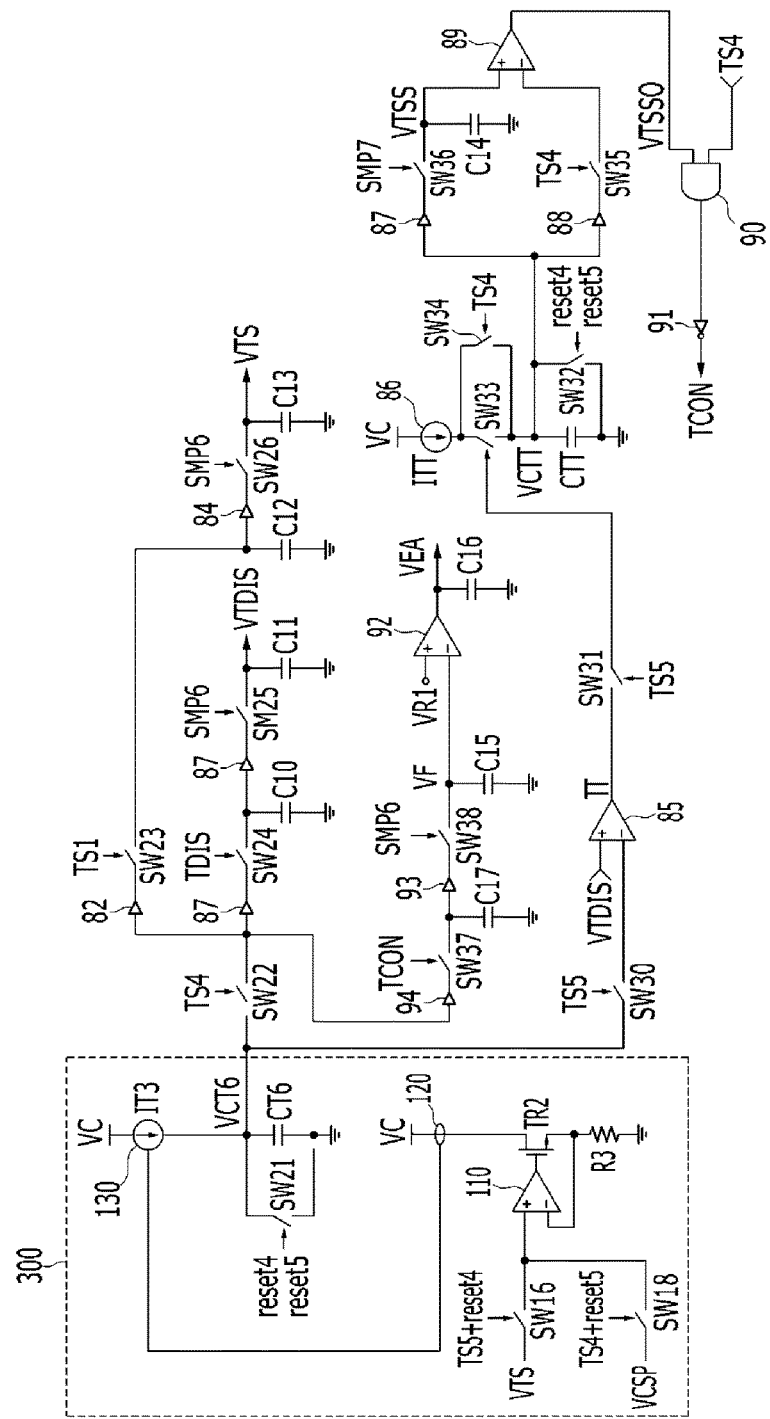
FIG. 14 is a view illustrating a switch control circuit including a signal calculator according to a seventh embodiment.

FIG. 14 is a view illustrating a switch control circuit including a signal calculator according to the seventh embodiment.

In FIG. 14, elements that configure the signal calculator are illustrated among elements of the switch control circuit 210. Like reference numerals will be used for like elements compared to the signal calculator according to the sixth embodiment, and detailed descriptions thereof will be omitted.

A signal generator 300 according to the seventh embodiment generates the current IT3 depending on a voltage selected from the two voltages VTS and VCSP every switching period, and charges the capacitor CT6 with the current IT3 to generate the voltage VCT6. The voltage VCT6 may be reset by at least one of reset signals reset4 and reset5 every switching period.

Unlike the sixth embodiment, in the seventh embodiment, the current source 130 and the capacitor CT6 are directly connected, a buffer 94 between the switch SW22 and the switch SW37, and a capacitor C17 connected to a node between the switch SW37 and the buffer 93 is further included.

In addition, the switch SW16 performs a switching operation according to a signal TS5 and the reset signal reset4, and the switch SW18 performs a switching operation according to a signal TS4 and the reset signal reset5. The switch SW37 performs a switching operation according to the signal TCON, the switches SW22, SW23, SW34, and SW35 perform switching operations according to the signal TS4, the switches SW30 and SW31 perform switching operations according to the signal TS5, the switches SW25 SW26, and SW38 perform switching operations according to a sampling signal SMP6, and the switch SW36 performs a switching operation according to a sampling signal SMP7.

The switch SW21 and the switch SW32 perform switching operations according to the reset signals reset4 and reset5.

Hereinafter, an operation of the signal calculator according to the seventh embodiment will be described with reference to FIG. 15.

Figure 15:
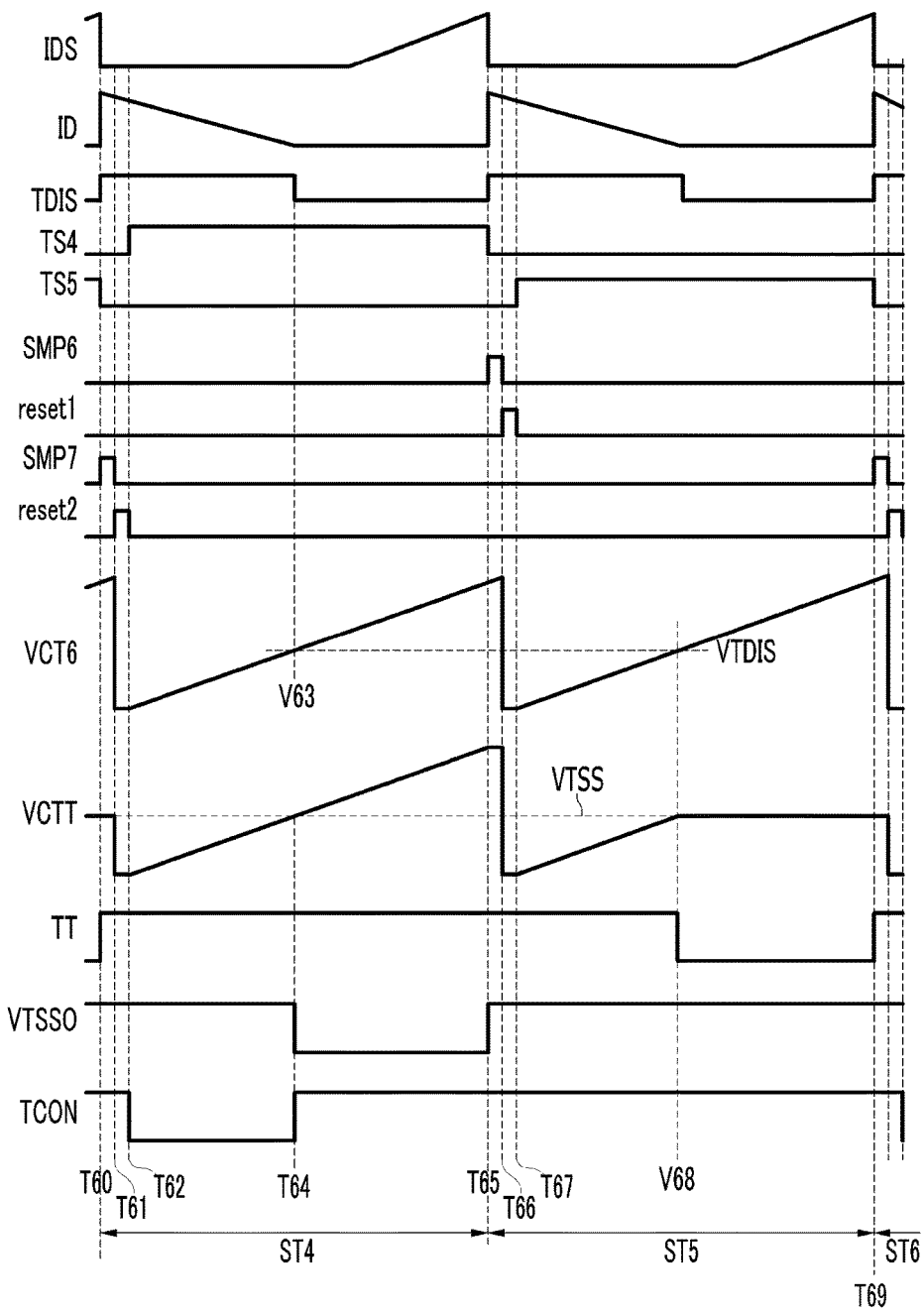
FIG. 15 is a view illustrating waveforms of signals of the signal calculator according to the seventh embodiment.

FIG. 15 is a view illustrating waveforms of signals of the signal calculator according to the seventh embodiment.

FIG. 15 also illustrates the voltage which controls the current source 130 changing every switching period. For example, the current IT3 of the current source 130 is determined by the voltage VTS during a switching period ST4, and the current IT3 of the current source 130 is determined by the voltage VCSP during a switching period ST5. From a period after the switching period ST5, the current IT3 of the current source 130 is determined again by the voltage VTS as in the switching period ST4. In this manner, when the number of voltages which control the current source 130 is two, the operation of controlling the current source 130 is repeated very two switching periods.

In every switching period, the current IDS increases during the period in which the power switch PT is turned on. At a time point T60, the power switch PT is turned off, the discharged current ID is generated, and the signal TDIS rises to a high level. The signal TDIS is a signal which represents a period in which the discharged current ID flows and has a high level during a period T60-T63 in which the discharged current ID decreases, and the switch SW24 is turned on during the period T60-T63.

At the time point T60, the sampling signal SMP7 rises to a high level and the switch SW36 is turned on. The voltage VCTT is sampled in the capacitor C14 via the switch SW36, and the voltage VTSS is determined. At the time point T60, the signal TS5 drops to a low level, and the switches SW16, SW30, and SW31 are turned off.

At the time point 60, the signal TS5 drops to a low level, and the switches SW30 and SW31 are turned off. Due to the switch SW30 being turned off, the voltage VTDIS becomes higher than the input to the inverting terminal (−) of the comparator 85, and the comparator 85 outputs the signal TT at a high level. However, since the switch SW31 is turned off and the signal TT is not transmitted to the switch SW33, the switch SW33 is turned off.

At a time point T61, the sampling signal SMP7 drops to a low level, and the reset signal reset5 rises to a high level. Then, the switch SW21 is turned on such that the voltage VCT6 is reset to the ground level by the discharge of the capacitor CT6, and the switch SW17 is turned on such that the current source 130 begins to generate the current IT3 according to the voltage VCSP.

In addition, at the time point T61, the switch SW32 is turned on, and the voltage VCTT is reset to the ground level by the discharge of the capacitor CTT.

At a time point T62, the reset signal reset5 drops to a low level, the signal TS4 rises to a high level, the switches SW21 and SW32 are turned off, and the switches SW22 and SW23 are turned on. Then, the capacitor CT6 is charged by the current IT3 according to the voltage VCSP, and the voltage VCT6 increases. From the time point T62, the capacitor C10 and the capacitor C12 are charged by the voltage VCT6.

At the time point T62, the switch SW34 is turned on, the capacitor CTT is charged by the current ITT, and the voltage VCTT rises. Since the switch SW35 is turned on during a high-level period of the signal TS4, the voltage VCTT is input to the inverting terminal (−) of the comparator 89. Since both of the two inputs to an AND gate 90 have a high level at the time point T62, the AND gate 90 outputs a high level, the output of the AND gate 90 is inverted by the inverter 91 such that the signal TCON drops to a low level, and the switch SW37 is turned off.

At a time point T63, the signal TDIS drops to a low level. The capacitor C10 is charged by the voltage VCT6 during a period T62-T63. At a time point T64, the voltage VCTT reaches the voltage VTSS and the signal VTSSO drops to a low level such that the output of the AND gate 90 begins to have a low level, the output of the AND gate 90 is inverted by the inverter 91 such that the signal TCON rises to a high level, and the switch SW37 is turned on such that the capacitor C17 is charged by the voltage VCT6.

At a time point T65, the power switch PT is turned off, the signal TS4 drops to a low level, the sampling signal SMP6 rises to a high level, the switches SW18, SW22, SW23, SW34, and SW35 are turned off, and the switches SW25, SW26, and SW38 are turned on. Then, a voltage charged in the capacitor C10 is sampled in the capacitor C11 such that the voltage VTDIS is determined, and a voltage charged in the capacitor C12 is sampled in the capacitor C13 such that the voltage VTS is determined. During a period T64-T65, a voltage charged in the capacitor C17 is sampled in the capacitor C15, and the voltage VF is determined.

At the time point T65, the switch SW35 is turned off and the voltage VTSS becomes larger than a voltage at the inverting terminal (−) of the comparator 89 such that the signal VTSSO rises to a high level. Since the signal TS4 drops to a low level, an output of the AND gate 90 has a low level, and the signal TCON is maintained at a high level.

At a time point T66, the sampling signal SMP6 drops to a low level, and the reset signal reset4 rises to a high level.

Then, the switch SW21 is turned on such that the voltage VCT6 is reset to the ground level by the discharge of the capacitor CT6, and the switch SW32 is turned on such that the voltage VCTT is reset to the ground level by the discharge of the capacitor CTT. At the time point T66, the switch SW16 is turned on, the current source 130 begins to generate the current IT3 according to the voltage VTS, and the switches SW25, SW26, and SW38 are turned off.

At a time point T67, the reset signal reset4 drops to a low level, the signal TS5 rises to a high level, the switches SW21 and SW32 are turned off, and the switches SW30 and SW31 are turned on. Then, the capacitor CT6 is charged by the current IT3 according to the voltage VTS, and the voltage VCT6 increases. By the switch SW31 being turned on, the signal TT at a high level is transmitted to the switch SW33, and the switch SW33 is turned on. Then, the capacitor CTT is charged by the current ITT, and the voltage VCTT begins to increase.

At a time point T68, when the voltage VCT6 that was increasing reaches the voltage VTDIS, the comparator 85 outputs the signal TT at a low level, and the switch SW33 is turned off. During a period T67-T68, the capacitor CTT is charged by the current ITT such that the voltage VCTT increases, and after the time point T68, a level of the voltage VCTT is maintained by the capacitor CTT.

At a time point T69, the sampling signal SMP7 begins to have a high level such that the voltage VCTT is sampled by the capacitor C14, and the voltage VTSS is stored in the capacitor C14.

Then, the operations during a period T60-T69 described above are repeated. For example, the operations during the period T60-T69 are repeated from the time point T69 of the next switching period ST6.

The signal calculators according to the sixth and seventh embodiments may use one current source and one capacitor to sample a voltage which increases every switching period, and may use the sampled voltage to perform various operations.

Although the embodiments of the present disclosure have been described in detail above, the scope of the present disclosure is not limited thereto, and various modifications and improvements which may be made by those of ordinary skill in the art using a fundamental concept of the present disclosure also belong to the scope of the present disclosure.

What is claimed is:
1. A signal calculator comprising:
a capacitor; and
a variable current source that is configured to:
charge the capacitor,
generate a current corresponding to a reference voltage during a first period, wherein a first voltage is generated using a voltage of the capacitor charged during an enable period of a first signal in the first period, and a second voltage is generated using a voltage of the capacitor charged during the first period, and
generate a current corresponding to the second voltage during a second period, wherein a second signal is generated according to a result of comparing the first voltage with the voltage of the capacitor in the second period, and a fourth voltage is generated by generating and sampling a third voltage which is increased according to a first current during an enable period of the second signal,
wherein the third voltage increases according to the first current during a third period,
wherein after a period for the third voltage to reach the fourth voltage has passed, the variable current source generates a current corresponding to a predetermined voltage, and
wherein the voltage of the capacitor is sampled at an end time point of the third period.
2. The signal calculator of claim 1, wherein a switching operation of a power switch is controlled according to a voltage on the basis of a result of comparing the voltage sampled at the end time point of the third period with a predetermined reference voltage, and the predetermined voltage corresponds to a peak voltage of a current flowing in the power switch.
3. The signal calculator of claim 1, further comprising:
a first switch coupled between the variable current source and a first end of the capacitor; and
a second switch coupled between the first and second ends of the capacitor, the second end of the capacitor being coupled to a ground voltage terminal.
4. The signal calculator of claim 3, wherein the first switch is turned off at an initial time point of the third period so that the voltage of the capacitor is sampled at the end time point of the third period.
5. The signal calculator of claim 3, further comprising:
a control circuit configured control the variable current source based on the reference voltage, the second voltage, and the predetermined voltage,
wherein the reference voltage is used in the first period, the second voltage is used in the second period, and the predetermined voltage is used to the third period.
6. The signal calculator of claim 5, wherein the control circuit comprises:
an amplifier including a non-inverting input terminal and an inverting terminal; the non-inverting input terminal receiving the reference voltage, the second voltage, and the predetermined voltage in the first, second, and third periods, respectively;
a transistor having a gate coupled to an output terminal of the amplifier and a source coupled to the inverting input terminal of the amplifier;
a current mirror configured to control the variable current source and coupled between a voltage supply terminal and a drain of the transistor; and
a resistor coupled between the source of the transistor and a ground voltage terminal.
7. The signal calculator of claim 6, wherein the non-inverting input terminal of the amplifier is coupled to third to fifth switches,
wherein the third switch supplying the reference voltage to the non-inverting input terminal when a third reset signal is enabled in the first period,
wherein the fourth switch supplying the second voltage to the non-inverting input terminal when a first reset signal is enabled in the second period,
wherein the fifth switch supplying the predetermined voltage to the non-inverting input terminal when a second reset signal is enabled in the third period, and
wherein the second switch is turned on when at least one of the first to third reset signals is enabled.
8. A signal calculator comprising:
a capacitor;
a variable current source that is configured to:
charge the capacitor,
generate a current corresponding to a predetermined voltage during a first period, wherein a first voltage is generated using a voltage of the capacitor charged during an enable period of a first signal in the first period, a second voltage is generated using a voltage of the capacitor charged during the first period, and generate a current corresponding to the second voltage during a second period, wherein a second signal is generated according to a result of comparing the first voltage with the voltage of the capacitor during the second period, and a fourth voltage is generated by generating and sampling a third voltage which is increased according to a first current during an enable period of the second signal in the second period.

9. The signal calculator of claim 8, wherein:

the variable current source generates a current corresponding to the predetermined voltage during a third period;

the signal calculator further comprises a first capacitor charged by the voltage of the capacitor from a time point at which a period for the third voltage which is increased according to the first current to reach the sampled fourth voltage has passed until an end time point of the third period in the third period;

the signal calculator samples a voltage of the first capacitor at the end time point of the third period and controls a switching operation of a power switch according to a voltage on the basis of a result of comparing the sampled voltage with a predetermined reference voltage; and the predetermined voltage corresponds to a peak voltage of a current flowing in the power switch.

10. The signal calculator of claim 8, further comprising:

a first switch coupled between first and second ends of the capacitor, the second end of the capacitor being coupled to a ground voltage terminal.

11. The signal calculator of claim 10, further comprising:

a control circuit configured control the variable current source based on the second voltage and the predetermined voltage, wherein the reference voltage is used in the first period, and the second voltage is used in the second period.

12. The signal calculator of claim 11, wherein the control circuit comprises:

an amplifier including a non-inverting input terminal and an inverting terminal; the non-inverting input terminal receiving the predetermined voltage and the second voltage in the first and second periods, respectively;

a transistor having a gate coupled to an output terminal of the amplifier and a source coupled to the inverting input terminal of the amplifier;

a current mirror configured to control the variable current source and coupled between a voltage supply terminal and a drain of the transistor; and a resistor coupled between the source of the transistor and a ground voltage terminal.

13. The signal calculator of claim 12, wherein the non-inverting input terminal of the amplifier is coupled to second and third switches, wherein the second switch supplying the reference voltage to the non-inverting input terminal when a second reset signal is enabled in the first period, wherein the third switch supplying the second voltage to the non-inverting input terminal when a first reset signal is enabled in the second period, and wherein the first switch is turned on when at least one of the first and second reset signals is enabled.

14. A power supply comprising:

a transformer;

a power switch coupled to the transformer; and a switch control circuit configured to control a switching operation of the power switch based on a voltage detected when the power switch is turned on, wherein the switch control circuit comprises a signal calculator, the signal calculator comprising:

a capacitor; and a variable current source that is configured to:

charge the capacitor, generate a current corresponding to a reference voltage during a first period, wherein a first voltage is generated using a voltage of the capacitor charged during an enable period of a first signal in the first period, and a second voltage is generated using a voltage of the capacitor charged during the first period, and generate a current corresponding to the second voltage during a second period, wherein a second signal is generated according to a result of comparing the first voltage with the voltage of the capacitor in the second period, and a fourth voltage is generated by generating and sampling a third voltage which is increased according to a first current during an enable period of the second signal, wherein the third voltage increases according to the first current during a third period, wherein after a period for the third voltage to reach the fourth voltage has passed, the variable current source generates a current corresponding to a predetermined voltage, and wherein the voltage of the capacitor is sampled at an end time point of the third period.

15. The power supply of claim 14, wherein the switching operation of the power switch is controlled according to a voltage on the basis of a result of comparing the voltage sampled at the end time point of the third period with a predetermined reference voltage, and the predetermined voltage corresponds to a peak voltage of a current flowing in the power switch.

16. A power supply comprising:

a transformer;

a power switch coupled to the transformer; and a switch control circuit configured to control a switching operation of the power switch based on a voltage detected when the power switch is turned on, wherein the switch control circuit comprises a signal calculator, the signal calculator comprising:

a capacitor;

a variable current source that is configured to:

charge the capacitor, generate a current corresponding to a predetermined voltage during a first period, wherein a first voltage is generated using a voltage of the capacitor charged during an enable period of a first signal in the first period, a second voltage is generated using a voltage of the capacitor charged during the first period, and generate a current corresponding to the second voltage during a second period, wherein a second signal is generated according to a result of comparing the first voltage with the voltage of the capacitor during the second period, and a fourth voltage is generated by generating and sampling a third voltage which is increased according to a first current during an enable period of the second signal in the second period.

17. The power supply of claim 16, wherein:

the variable current source generates a current corresponding to the predetermined voltage during a third period;

the signal calculator further comprises a first capacitor charged by the voltage of the capacitor from a time point at which a period for the third voltage which is increased according to the first current to reach the sampled fourth voltage has passed until an end time point of the third period in the third period;

the signal calculator samples a voltage of the first capacitor at the end time point of the third period and controls a switching operation of a power switch according to a voltage on the basis of a result of comparing the sampled voltage with a predetermined reference voltage; and the predetermined voltage corresponds to a peak voltage of a current flowing in the power switch.

* * * * *